(12) United States Patent
Kinoshita et al.

(10) Patent No.: US 12,179,484 B2
(45) Date of Patent: Dec. 31, 2024

(54) LIQUID EJECTING HEAD UNIT AND LIQUID EJECTING APPARATUS

(71) Applicant: SEIKO EPSON CORPORATION, Tokyo (JP)

(72) Inventors: Ryota Kinoshita, Matsumoto (JP); Taiki Hanagami, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 161 days.

(21) Appl. No.: 18/153,419

(22) Filed: Jan. 12, 2023

(65) Prior Publication Data

US 2023/0219340 A1  Jul. 13, 2023

(30) Foreign Application Priority Data

Jan. 13, 2022 (JP) ................ 2022-003470

(51) Int. Cl.
*B41J 2/14* (2006.01)
*H05K 1/02* (2006.01)

(52) U.S. Cl.
CPC .............. *B41J 2/14* (2013.01); *H05K 1/0201* (2013.01); *B41J 2002/14491* (2013.01); *H05K 2201/064* (2013.01)

(58) Field of Classification Search
CPC .... B41J 2/14; H05K 1/0201; H05K 2201/064
See application file for complete search history.

(56) References Cited

U.S. PATENT DOCUMENTS

2011/0316942 A1* 12/2011 Koyama .............. B41J 2/14024
347/85

FOREIGN PATENT DOCUMENTS

JP  2014-004767 A  1/2014

* cited by examiner

*Primary Examiner* — Thinh H Nguyen
(74) *Attorney, Agent, or Firm* — Harness, Dickey & Pierce, P.L.C.

(57) ABSTRACT

A liquid ejecting head unit includes a first connector configured to be coupled to an external wiring member. The liquid ejecting head unit includes a wiring board having the first connector, a housing for the liquid ejecting head unit, the housing having an opening through which the first connector is exposed outside and having a housing space accommodating the wiring board, and a flexible member in the housing space. The flexible member separates the housing space into a first space that has at least a portion of the first connector and the opening and a second space that is larger than the first space.

16 Claims, 14 Drawing Sheets

FIG. 14
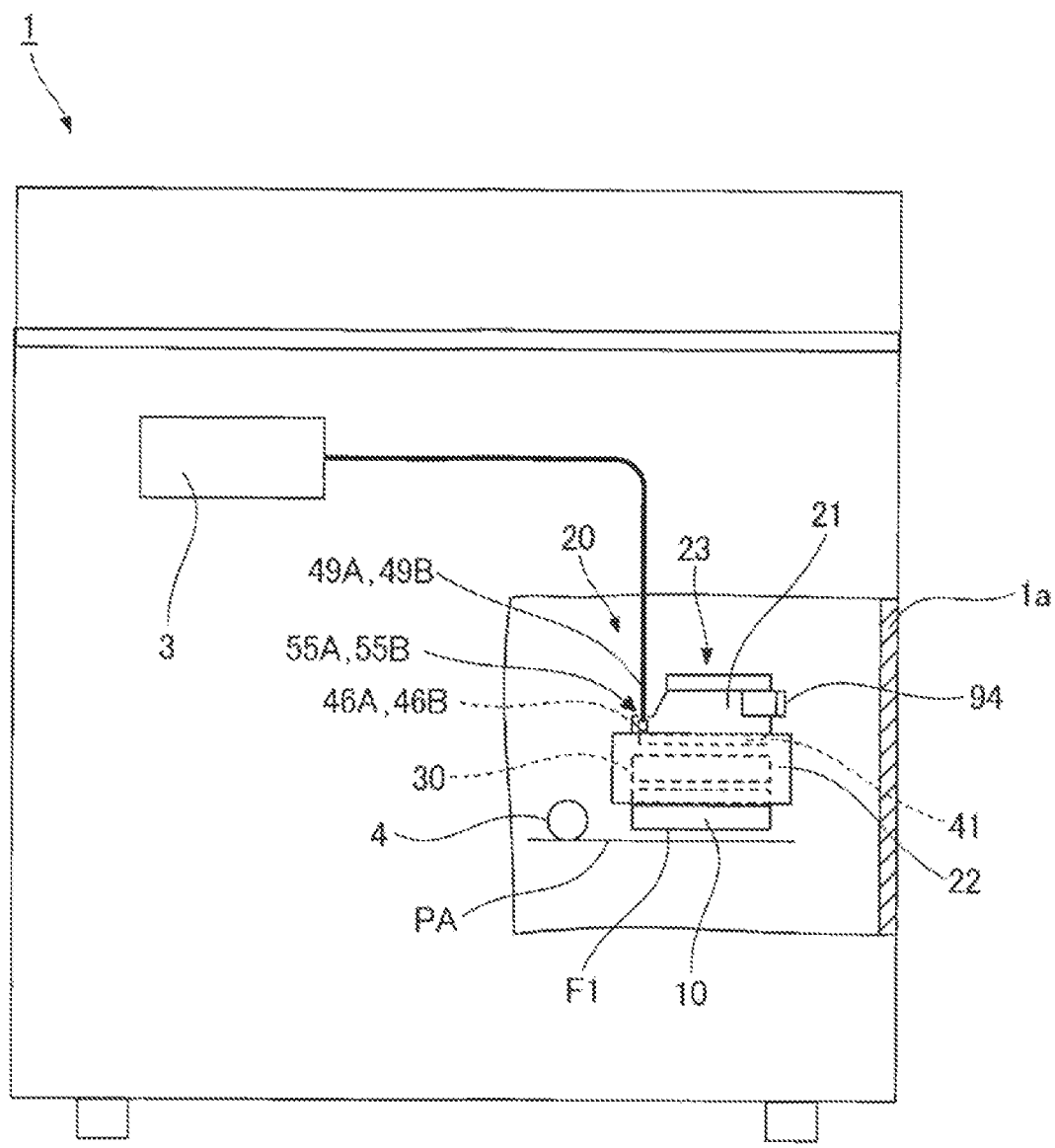
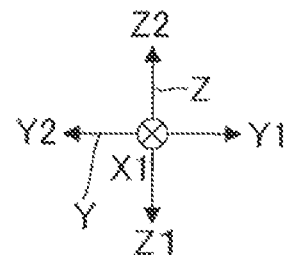

LIQUID EJECTING HEAD UNIT AND LIQUID EJECTING APPARATUS

The present application is based on, and claims priority from JP Application Serial Number 2022-003470, filed Jan. 13, 2022, the disclosure of which is hereby incorporated by reference herein in its entirety.

BACKGROUND

1. Technical Field

The present disclosure relates to a liquid ejecting head unit and a liquid ejecting apparatus.

2. Related Art

For example, the liquid discharge head disclosed in JP-A-2014-4767 includes a wiring board that has an internal connector and a housing that accommodates the wiring board. The housing has an opening that allows connection between the internal connector coupled to the internal wiring board and a connector that is an external wiring member. Furthermore, the housing has a cover formed of a flexible member, and the cover has an opening to which the external wiring member is inserted. In the liquid discharge head disclosed in JP-A-2014-4767, the inner circumferential surface of the opening in the cover and the external wiring member inserted in the opening are in contact with each other to prevent mist from entering the housing.

For example, a known technology has a slit in the cover covering the internal connector such that the opening of the cover to which the external wiring member is inserted can widen. In the known technology, the cover has a slit, but the cover covers the internal connector, and thus the insertion/extraction operability of the external wiring member is low. Specifically, contact between the inner circumferential surface of the opening of the cover and the external wiring member lowers the insertion/extraction operability of the external connector.

SUMMARY

According to an aspect of the present disclosure, a liquid ejecting head unit includes a first connector to be coupled to an external wiring member. The liquid ejecting head unit includes a wiring board having the first connector, a housing for the liquid ejecting head unit, the housing having an opening through which the first connector is exposed outside and having a housing space accommodating the wiring board, and a flexible member in the housing space. The flexible member separates the housing space into a first space that has at least a portion of the first connector and the opening and a second space that is larger than the first space.

According to another aspect of the present disclosure, a liquid ejecting apparatus includes the liquid ejecting head unit and an external wiring member located outside the liquid ejecting head unit and coupled to the first connector.

BRIEF DESCRIPTION OF THE DRAWINGS

FIG. 14 is a side view illustrating a housing of the liquid ejecting apparatus including the head unit.

DESCRIPTION OF EXEMPLARY EMBODIMENTS

Figure 1:
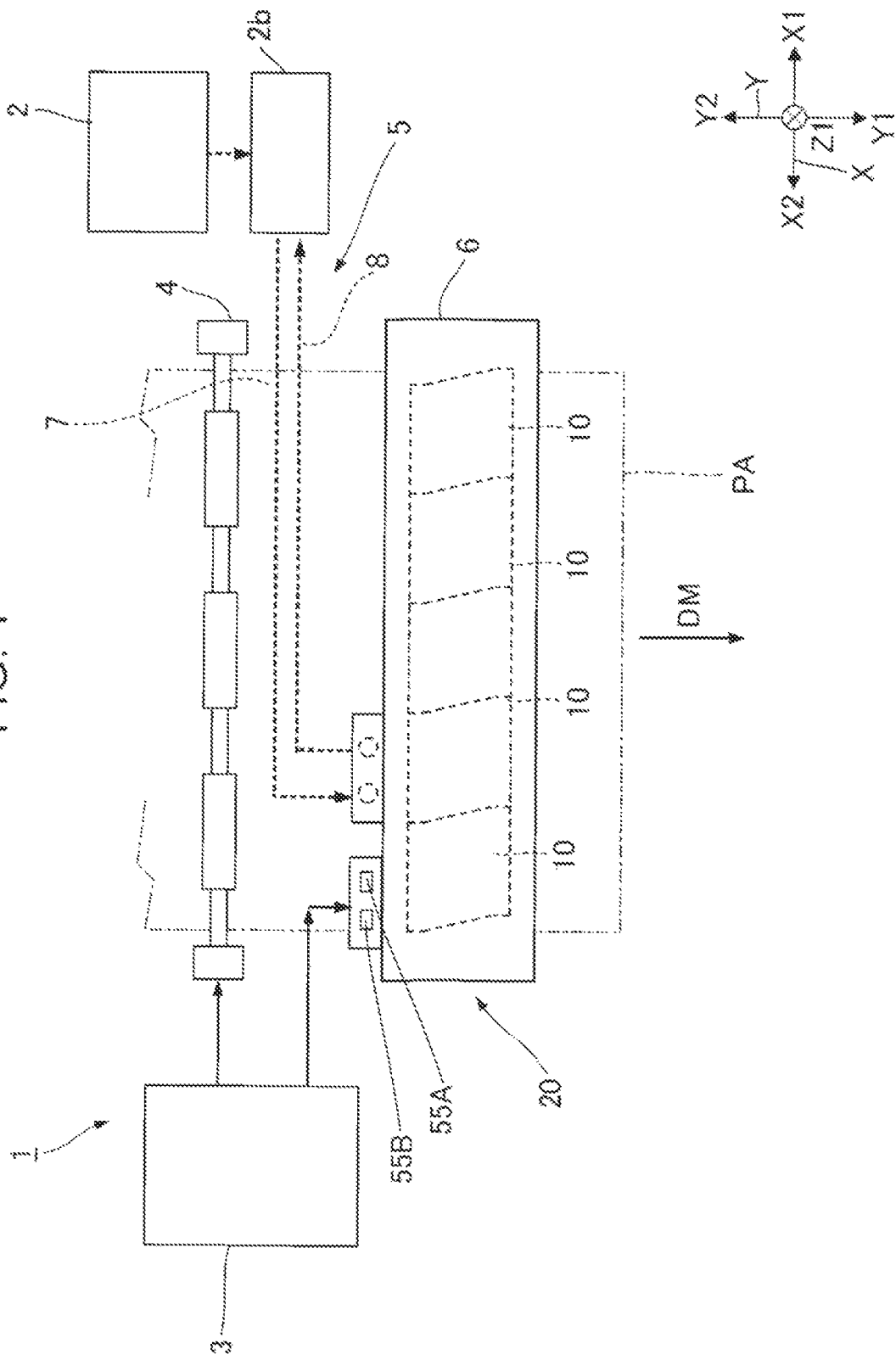
FIG. 1 is a schematic view illustrating a liquid ejecting apparatus according to a first embodiment.

Hereinafter, embodiments of the present disclosure will be described with reference to the drawings. In the drawings, the components are illustrated in different dimensions and different scale ratios from the actual components. Although various technically preferable limitations are made in the embodiments described below to illustrate specific preferable examples of the present disclosure, it should be noted that the scope of the disclosure is not limited to these embodiments unless such limitations are explicitly mentioned to limit the disclosure in the following description.

In the following description, three directions intersecting each other may be referred to as an X axis direction, a Y axis direction, and a Z axis direction. The X axis direction includes an X1 direction and an X2 direction, which are opposite directions. The Y axis direction includes a Y1 direction and a Y2 direction, which are opposite directions. The Z axis direction includes a Z1 direction and a Z2 direction, which are opposite directions. The X axis direction, the Y axis direction, and the Z axis direction are perpendicular to each other.

1. First Embodiment

FIG. 1 is a schematic view illustrating a liquid ejecting apparatus 1 according to a first embodiment. The liquid ejecting apparatus 1 is an ink jet printer that ejects ink, which is an example of "liquid", in the form of liquid droplets onto a medium PA. The liquid ejecting apparatus 1 according to this embodiment has nozzles, through which the ink is ejected, over the entire width of the medium PA, i.e., the liquid ejecting apparatus 1 is a line printer. The medium PA is typically a print sheet. The medium PA is not limited to the print sheet and may be a print target formed of any material, such as a resin film and a fabric.

As illustrated in FIG. 1, the liquid ejecting apparatus 1 includes a liquid reservoir 2, a control unit 3, a medium transport mechanism 4, a circulation mechanism 5, and a head unit 20. The head unit 20 includes multiple liquid ejecting heads 10.

The liquid reservoir 2 stores ink. Examples of the specific form of the liquid reservoir 2 include a cartridge detachable from the liquid ejecting apparatus 1, an ink pouch formed of a flexible film, and an ink tank refillable with ink. The ink stored in the liquid reservoir 2 may be any kind of ink. The liquid ejecting apparatus 1 includes multiple liquid reservoirs 2 depending on the number of kinds of ink. The liquid ejecting apparatus 1 may include one liquid reservoir 2.

The control unit 3 controls the operation of the components of the liquid ejecting apparatus 1. The control unit 3 includes, for example, a processing circuit, such as a CPU and a FPGA, and a memory circuit, such as a semiconductor memory. The memory circuit stores various programs and various data. The processing circuit executes the programs and uses the appropriate data to control the components. CPU is an acronym for "Central Processing Unit." FPGA is an acronym for "Field Programmable Gate Array."

The medium transport mechanism 4 transports a medium PA in a transport direction DM under the control of the control unit 3. The medium transport mechanism 4 includes a transport roller that is long in the width direction of the medium PA and a motor that rotates the transport roller. The medium transport mechanism 4 should not be limited to the configuration including the transport roller and may have a configuration, for example, that has a drum or an endless belt that transports the medium PA with the medium PA being attached to the outer circumferential surface by, for example, an electrostatic force.

The liquid ejecting head 10 is controlled by the control unit 3 and ejects ink, which is supplied from the liquid reservoir 2 through the circulation mechanism 5, onto the medium PA through the nozzles. The liquid ejecting heads 10 are arranged in a direction intersecting the transport direction DM to constitute the line head 6.

The ink in the liquid reservoir 2 is supplied to the liquid ejecting head 10 through the circulation mechanism 5. The circulation mechanism 5 supplies the ink to the liquid ejecting head 10 and collects the ink discharged from the liquid ejecting head 10. The circulation mechanism 5 supplies the collected ink again to the liquid ejecting head 10. The circulation mechanism 5 includes a supply passage 7 through which the ink is supplied to the liquid ejecting head 10, a discharge passage 8 through which the ink discharged from the liquid ejecting head 10 is collected, a sub tank 2b that stores the collected ink, and a pump that sends the ink. The supply passage 7 and the discharge passage 8 are, for example, pipes or tubes. The supply passage 7 and the discharge passage 8 each may be a structure having a groove or a recess along which liquid flows.

Figure 2:
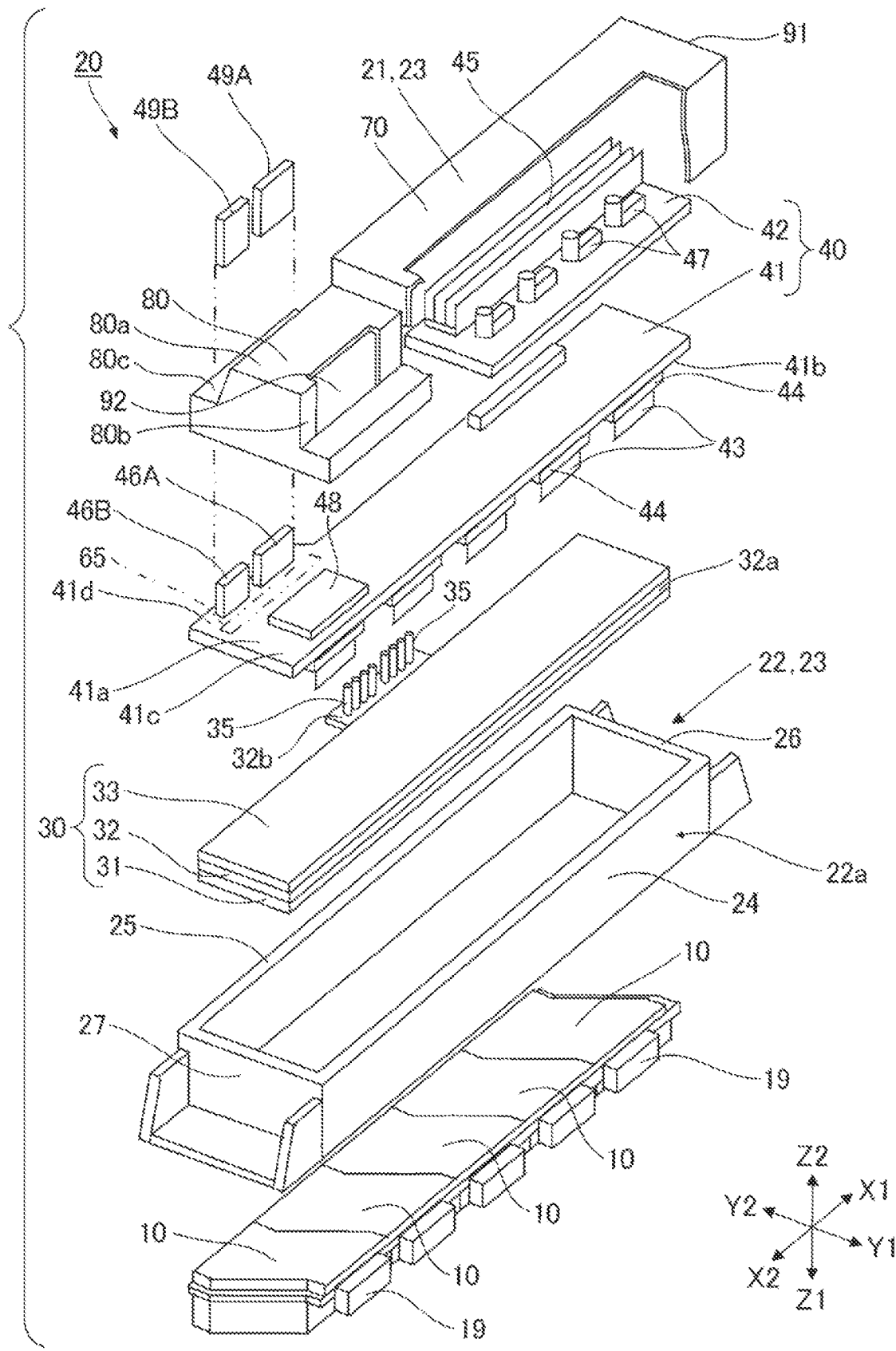
FIG. 2 is an exploded perspective view illustrating a head unit.
Figure 3:
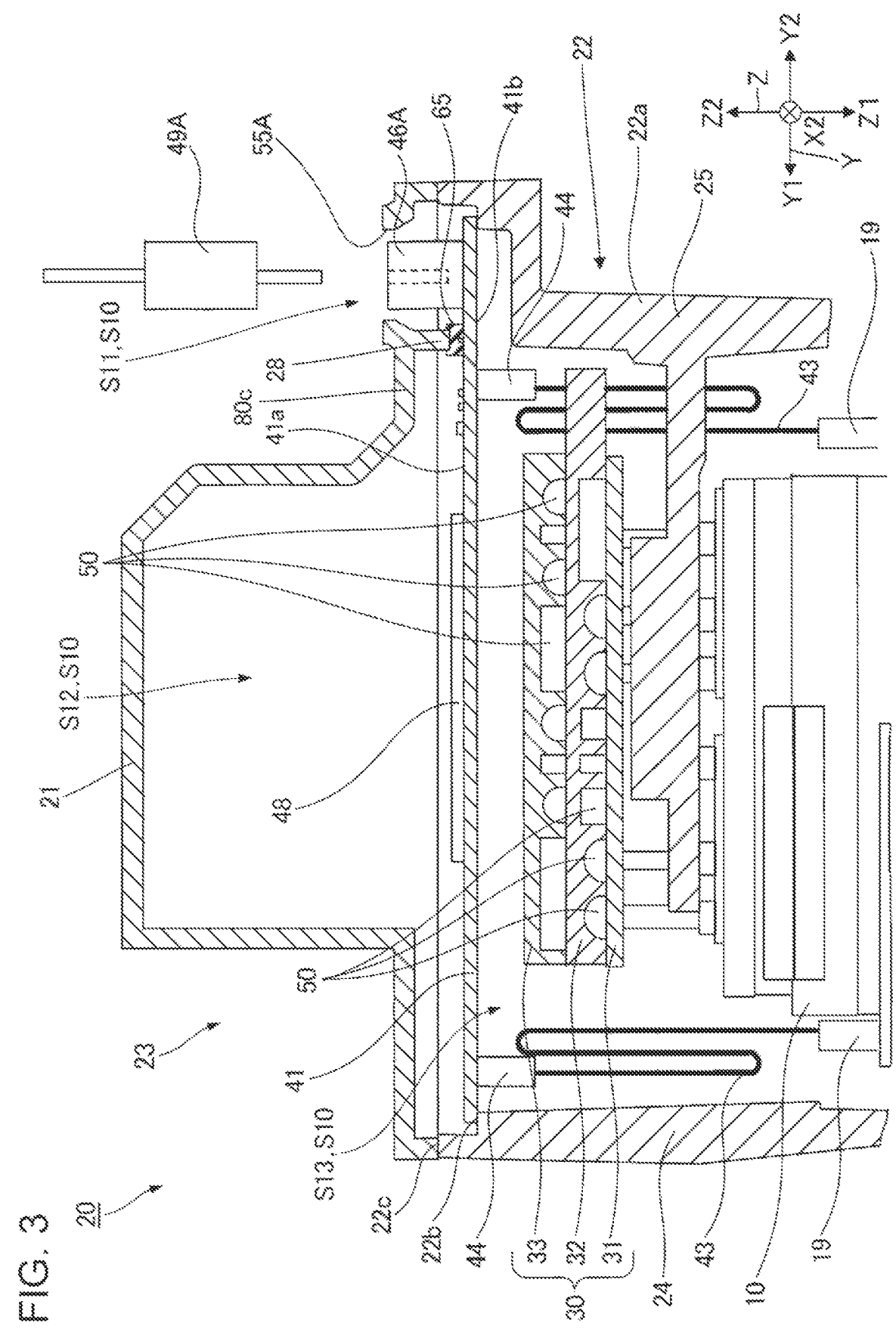
FIG. 3 is a cross-sectional view illustrating a portion of the head unit.

Next, the head unit 20 will be described with reference to FIGS. 2 to 8. FIG. 2 is an exploded perspective view illustrating the head unit 20. FIG. 3 is a cross-sectional view illustrating a portion of the head unit 20. The head unit 20 includes multiple liquid ejecting heads 10, a housing 23, a common passage member 30, and a circuit board portion 40. The housing 23 includes a cover 21 and a base member 22. FIG. 3 illustrates an upper portion of the head unit 20 and does not illustrate a lower portion of the base member 22 and a lower portion of the liquid ejecting head 10. The base member 22 is an example of "a first member". The cover 21 is an example of "a second member stacked on the first member". The expression "stacked on the first member" includes "located on the first member", and a component stacked on the first member should not be limited to a component in the form of layer.

The housing 23 has a housing space S10 as the internal space. The housing space S10 of the housing 23 includes a housing space in the cover 21 and a housing space in the base member 22. The housing space S10 accommodates the liquid ejecting heads 10, the common passage member 30, and the circuit board portion 40.

The base member 22 supports the liquid ejecting heads 10 and the common passage member 30. The circuit board portion 40 and the cover 21 are fixed to the base member 22. As illustrated in FIG. 3, the cover 21 is located in the Z2 direction relative to the base member 22. The cover 21 is stacked on the base member 22. The cover 21 should not be limited to one directly attached to the base member 22 and may be attached via another member. The cover 21 may be composed of multiple members. The base member 22 may also be composed of multiple members.

Figure 4:
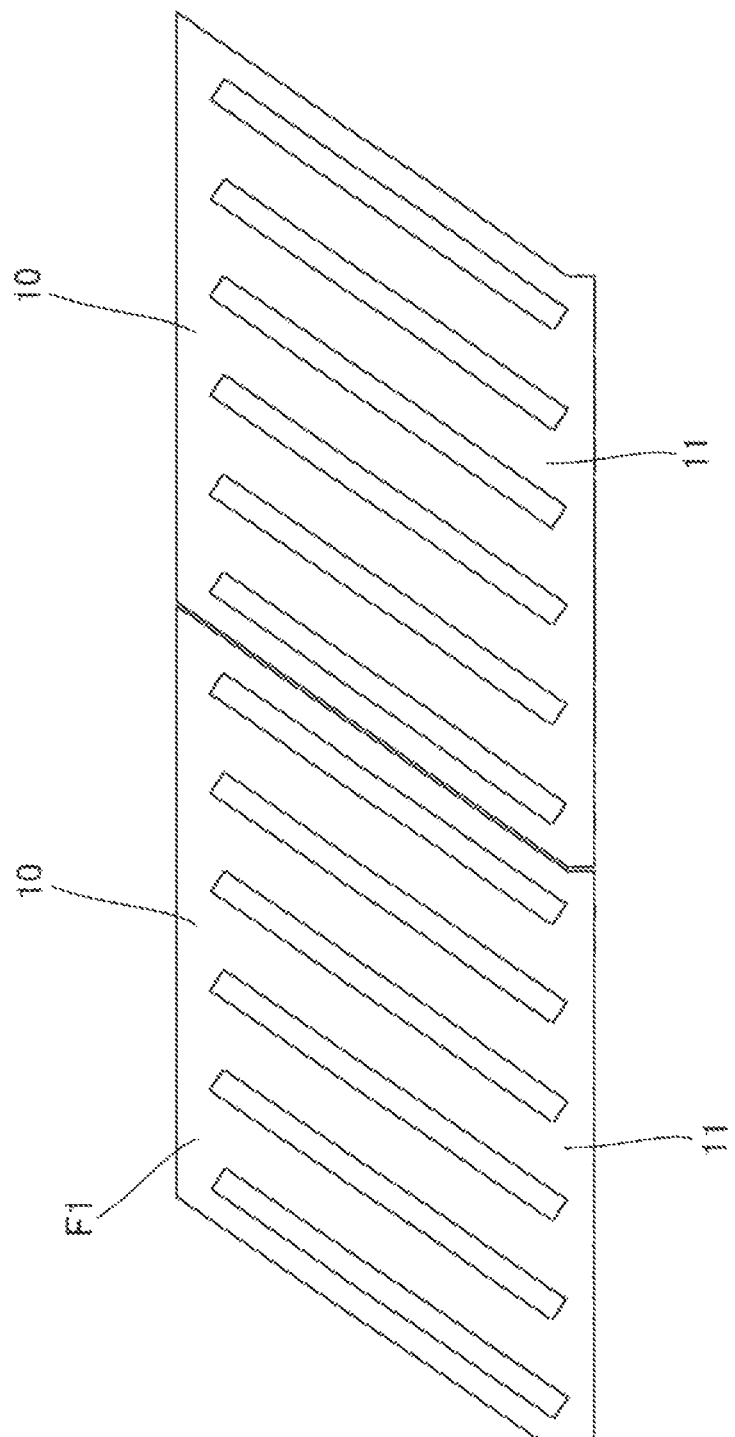
FIG. 4 is a bottom view illustrating an ejecting surface of the head unit.

Most of the liquid ejecting head 10 is accommodated in the housing space S10 of the base member 22. A portion of the liquid ejecting head 10 located at an end in the Z1 direction and including an ejecting surface F1 may be located outside the base member 22. FIG. 4 illustrates the ejecting surface F1 of the liquid ejecting heads 10. The ejecting surface F1 is exposed to the outside.

The base member 22 illustrated in FIGS. 2 and 3 includes a frame 22a. The frame 22a has a rectangular shape when viewed in the Z axis direction. The frame 22a includes side walls 24 to 27. The side walls 24 and 25 are away from each other in the Y axis direction. The thickness direction of the side walls 24 and 25 corresponds to the Y axis direction. The side wall 25 is located in the Y2 direction relative to the side wall 24. The side walls 26 and 27 are away from each other in the X direction. The thickness direction of the side walls 26 and 27 corresponds to the X axis direction. The side wall 27 is located in the X2 direction relative to the side wall 26.

The common passage member 30 includes passage substrates 31 to 33. The thickness direction of the passage substrates 31 to 33 corresponds to the Z axis direction. The passage substrates 31 to 33 are stacked in the Z axis direction. As illustrated in FIG. 3, the common passage member 30 has internal common passages 50. The passage substrates 32 and 33 have at least one of a groove and a through hole. The passage substrate 31 has through holes in communication with the grooves of the passage substrate 32. The passage substrate 32 has through holes in communication with the grooves of the passage substrate 33. The grooves and the through holes constitute the common passage 50 through which the ink flows.

The common passage member 30 is located in the Z2 direction relative to the liquid ejecting heads 10. The common passage member 30 is located between the circuit board portion 40 and the liquid ejecting head 10 in the Z axis direction. The passage substrate 31 is closer than the passage substrate 32 to the liquid ejecting head 10 in the Z axis direction. The passage substrate 33 is located in the Z2 direction relative to the passage substrate 32. The common passage member 30 of this embodiment includes three passage substrates 31 to 33, but the common passage member 30 may include two stacked passage substrates 31 and 32.

Figure 5:
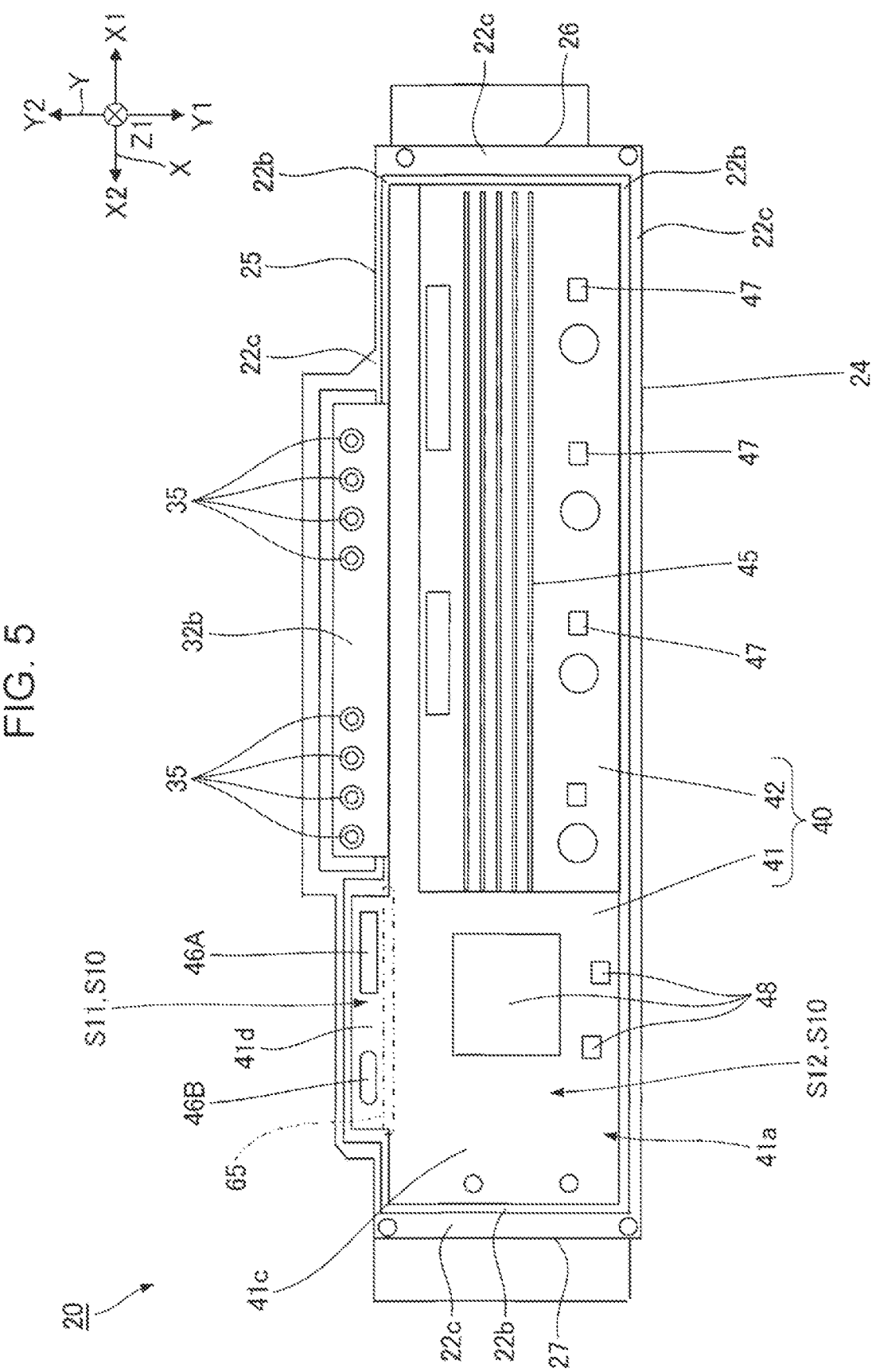
FIG. 5 is a bottom view illustrating a head unit without a cover.

The passage substrate 32 has a body 32a and a protrusion 32b protruding from the body 32a in the Y2 direction. The body 32a has a substantially rectangular shape when viewed in the Z axis direction. The body 32a of the passage substrate 32 is located between the passage substrate 31 and the passage substrate 33 in the Z axis direction. The protrusion 32b of the passage substrate 32 does not overlap the passage substrates 31 and 33 in the Z axis direction. FIG. 5 is a plan view illustrating the head unit 20 without the cover 21. As illustrated in FIG. 5, the protrusion 32b of the passage substrate 32 is exposed to the outside when viewed in the Z axis direction. The passage substrate 32 has passage tubes 35 protruding in the Z2 direction. The passage tubes 35 are on the protrusion 32b of the passage substrate 32 and exposed to the outside. The passage tubes 35 are in communication with the common passages 50 of the common passage member 30.

The common passages 50 of the common passage member 30 are coupled to the supply passage 7 and the discharge passage 8 illustrated in FIG. 1 through the passage tubes 35. The ink that has flowed through the supply passage 7 flows through the common passages 50 of the common passage member 30 to the liquid ejecting head 10. The ink discharged from the liquid ejecting heads 10 flows through the common passages 50 in the common passage member 30 to the discharge passage 8. The ink passed through the discharge passage 8 is collected in the sub tank 2b.

The circuit board portion 40 includes a relay board 41 and a control board 42. The thickness direction of the relay board 41 and the control board 42 corresponds to the Z axis direction. The relay board 41 is located in the Z2 direction relative to the common passage member 30. The control board 42 is located in the Z2 direction relative to the relay board 41. The relay board 41 and the control board 42 are away from each other in the Z axis direction.

The relay board 41 is mounted on the base member 22. The base member 22 has a stepped surface 22b on which the relay board 41 is located. The base member 22 has the stepped surface 22b on an end portion in the Z2 direction of the frame 22a. The stepped surface 22b is located away in the Z1 direction from an end surface 22c of the frame 22a located at the end in the Z2 direction. The surface 41b of the relay board 41 that faces in the Z1 direction has an edge in contact with the stepped surface 22b.

The relay board 41 is fixed to the base member 22. The relay board 41 is screwed to the base member 22. The control board 42 is screwed to the base member 22. The relay board 41 and the control board 42 are electrically coupled to each other by wiring (not illustrated). The relay board 41 extends in the X axis direction over the liquid ejecting heads 10. The relay board 41 overlaps the liquid ejecting heads 10 when viewed in the Z axis direction.

The relay board 41 is electrically coupled to connectors 19 of the liquid ejecting head 10 through flexible wiring boards 43. The relay board 41 is, for example, a rigid substrate. The flexible wiring board 43 may be an FFC. The relay board 41 has connectors 44 coupled to the flexible wiring boards 43. As illustrated in FIG. 3, the relay board 41 has a surface 41a and a surface 41b. The surface 41a faces in the Z2 direction, and the surface 41b faces in the Z1 direction. The surface 41b is a surface opposite the surface 41a. The connectors 44 of the relay board 41 are located on the surface 41b. The surface 41a is an example of "a first surface of the wiring board". The surface 41b is an example of "a second surface of the wiring board".

The relay board 41 separates the housing space S10 of the housing 23 in the Z axis direction. In other words, the housing space S10 of the housing 23 includes first and second spaces S11 and S12 located in the Z2 direction relative to the relay board 41 and a third space S13 located in the Z1 direction relative to the relay board 41.

As illustrated in FIGS. 2 and 5, the control board 42 has at least one IC chip 47 and at least one heat sink 45. The control board 42 is, for example, a rigid board. The IC chip 47 includes a drive signal generating circuit. The drive signal generating circuit can generate a drive signal for driving a piezoelectric element of the liquid ejecting head 10. Furthermore, the IC chip 47 may include a step-down circuit or a step-up circuit that can generate a reference voltage signal, which is a reference potential for use in ejection of ink from the liquid ejecting head 10. The relay board 41 and the control board 42 include a circuit element 48, a wiring line, a connector, and other electrical components. The relay board 41 has at least one circuit element 48 thereon. The circuit element 48 includes a discrete component, such as a resistor, a capacitor, a transistor, or a coil.

The lengthwise direction of the relay board 41, the control board 42, and the heat sink 45 corresponds to the X axis direction. The widthwise direction of the relay board 41, the control board 42, and the heat sink 45 corresponds to the Y axis direction. The relay board 41 is longer in the X axis direction than the control board 42. When viewed in the Z axis direction, the relay board 41 protrudes from the control board 42 in the X2 direction. In other words, the relay board 41 extends closer to the side wall 27 of the base member 22 than the control board 42.

The heat sink 45 is located at substantially the same position in the X axis direction as the control board 42. When viewed in the Z axis direction, the relay board 41 protrudes from the heat sink 45 in the X2 direction.

The relay board 41 includes a body 41c and a protrusion 41d protruding from the body 41c in the Y2 direction. The body 41c has a substantially rectangular shape when viewed in the Z axis direction. The protrusion 41d has a substantially rectangular shape when viewed in the Z axis direction. The protrusion 41d is located near the end in the X2 direction of the body 41c and protrudes in the Y2 direction. When viewed in the Z axis direction, the protrusion 41d is located in the X2 direction relative to the protrusion 32b of the passage substrate 32. When viewed in the Z axis direction, the protrusion 41d is located in the X2 direction relative to the heat sink 45 and the control board 42.

The relay board 41 has connectors 46A and 46B to be coupled to external electrical wiring lines 49A and 49B of the head unit 20. The connector 46A is an example of "the first connector". The connector 46B is an example of "the second connector". The relay board 41 is an example of "the wiring board having the first connector". The connector 46B may be "the first connector", and the connector 46A may be "the second connector".

The relay board 41 has the connectors 46A and 46B on the protrusion 41d. The connectors 46A and 46B are on the surface 41a of the protrusion 41d of the relay board 41 that faces in the Z2 direction. The surface of the connector 46A facing in the Z2 direction has an opening to which electrical wiring line 49A is inserted. The surface of the connector 46B facing in the Z2 direction has an opening to which the electrical wiring line 49B is inserted.

The cover 21 is fixed to the base member 22. The cover 21 is screwed to the base member 22. As illustrated in FIG. 2, the cover 21 includes a first portion 70 and a second portion 80. The first portion 70 covers a portion of the relay board 41, the control board 42, and the heat sink 45. Here, "a portion of the relay board 41" is a portion overlapping the control board 42 when viewed in the Z axis direction. The second portion 80 covers the rest of the relay board 41 and the connectors 46A and 46B. The connectors 46A and 46B are exposed to the outside through the openings 55A and 55B (described later) but are regarded as being covered by the second portion 80 of the cover 21.

The cover 21 has an inlet 91 and an outlet 92. The cover 21 has the inlet 91 at the end in the X1 direction of the first portion 70. The first portion 70 has an opening as the inlet 91 at the end in the X1 direction. The air outside the cover 21 flows into the cover 21 through the inlet 91. The air entered through the inlet 91 flows through the first portion 70 of the cover 21 in the X2 direction to the second portion 80 of the cover 21. The air flowing in the first portion 70 of the cover 21 cools the IC chip 47 and other components via the heat sink 45, for example.

Figure 6:
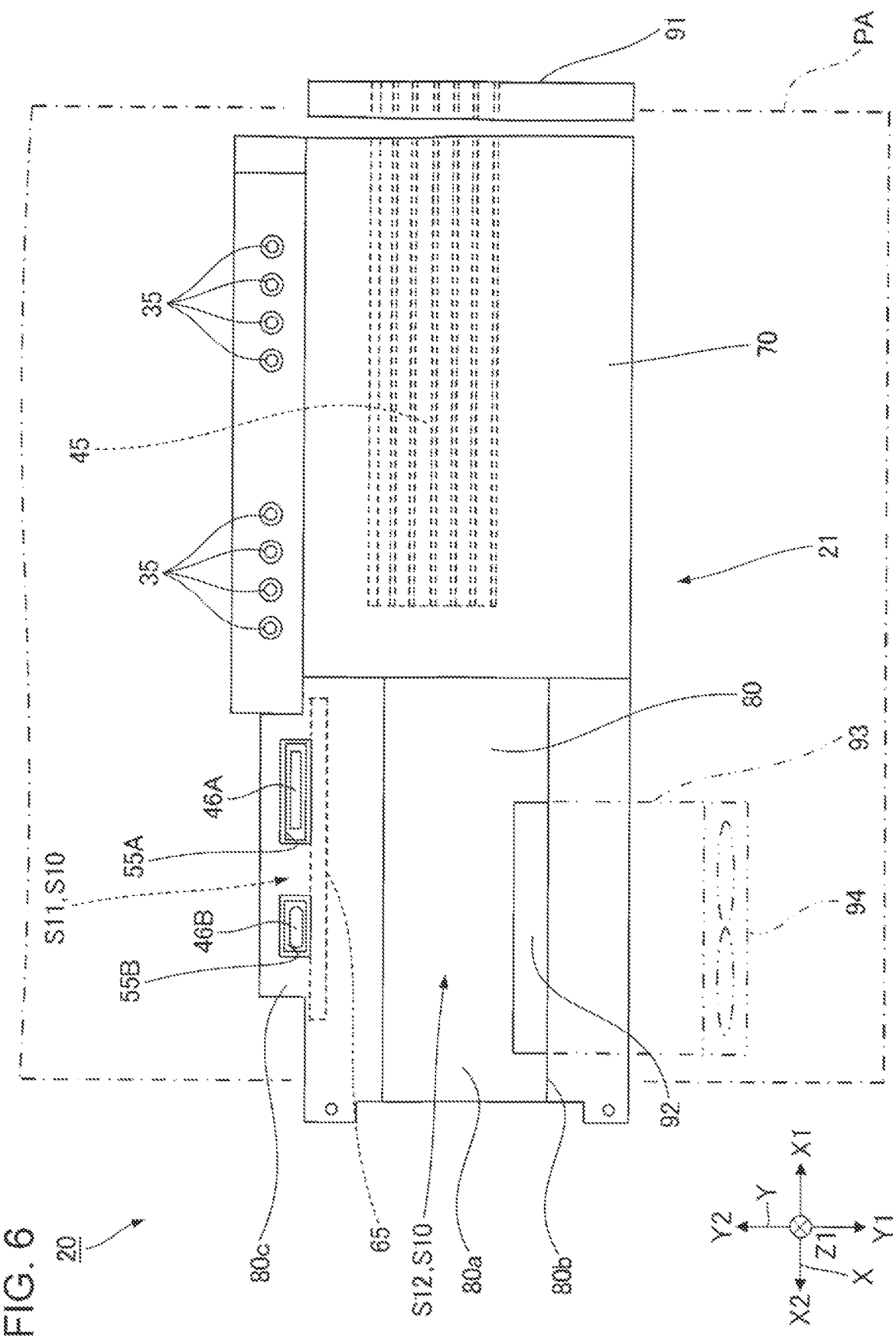
FIG. 6 is a plan view illustrating a portion of the head unit.

FIG. 6 is a plan view illustrating a portion of the head unit 20. As illustrated in FIGS. 2 and 6, the cover 21 has the outlet 92 in the wall 80b located at the end in the Y1 direction of the second portion 80. Furthermore, as illustrated in FIG. 6, a portion of the outlet 92 may be located in the wall 80a, which is located at the end in the Z2 direction of the second portion 80, at a position near the wall 80b. The thickness direction of the wall 80a corresponds to the Z axis direction. The thickness direction of the wall 80b corresponds to the Y axis direction. When viewed in the Z axis direction, the outlet 92 is located in the Y1 direction relative to the connectors 46A and 46B. The air entered the second portion 80 from the first portion 70 changes the flow direction to the Y1 direction, and the air is discharged through the outlet 92 to the outside of the cover 21.

Figure 7:
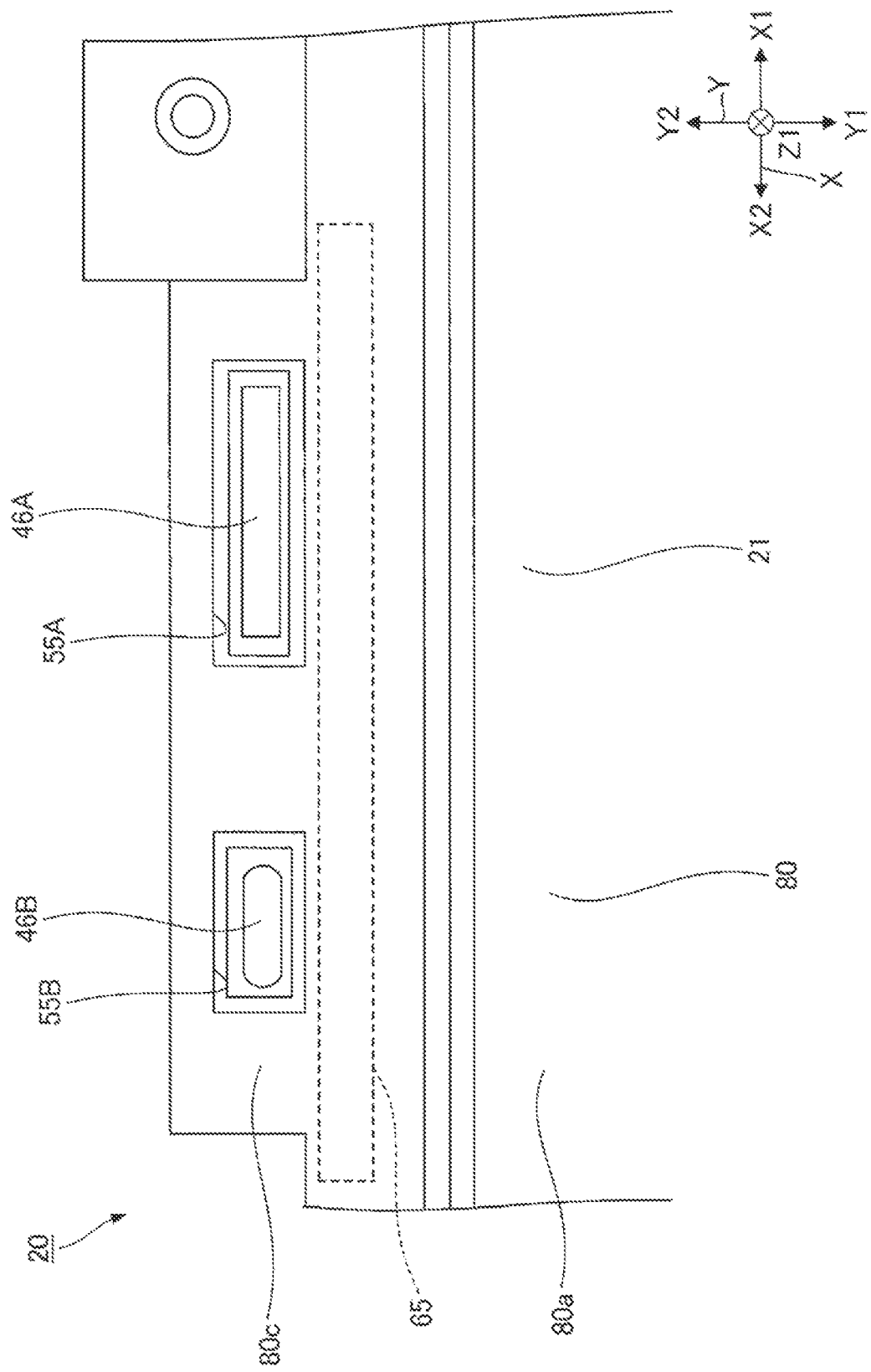
FIG. 7 is a magnified plan view illustrating openings in the cover and connectors exposed through the openings.
Figure 8:
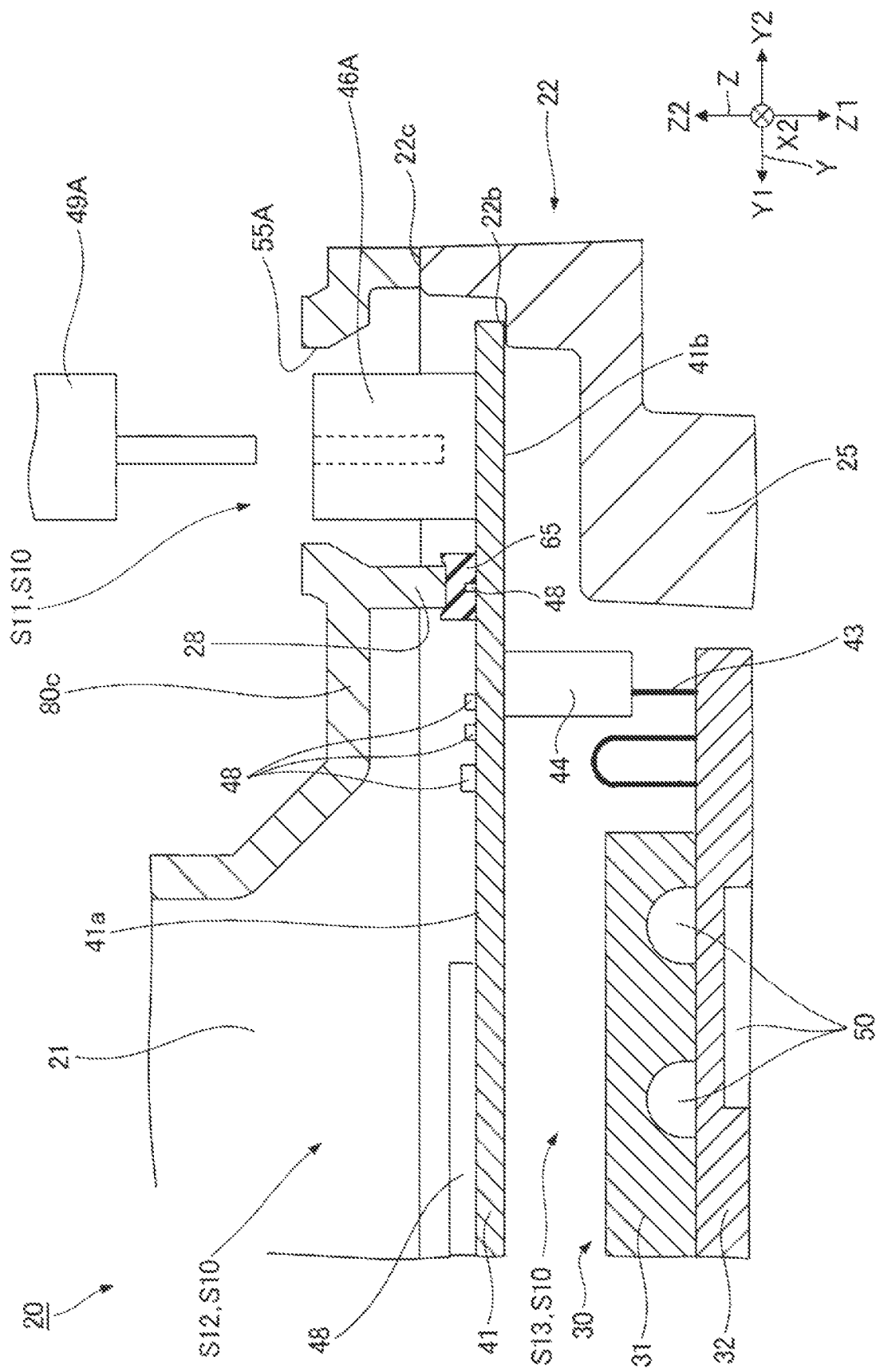
FIG. 8 is a magnified cross-sectional view illustrating a portion of the head unit.

Next, the openings 55A and 55B in the cover 21 will be described. FIG. 7 is a magnified plan view illustrating the openings 55A and 55B in the cover 21 and the connectors 46A and 46B exposed through the openings 55A and 55B. FIG. 8 is a magnified cross-sectional view illustrating a portion of the head unit 20. As illustrated in FIGS. 6 to 8, the cover 21 has the openings 55A and 55B. The openings 55A and 55B are arranged in the X axis direction. The opening 55A is located in the X1 direction relative to the opening 55B. The connector 46A is exposed to the outside through the opening 55A. The connector 46B is exposed to the outside through the opening 55B.

The openings 55A and 55B are in a wall 80c of the cover 21. The wall 80c has a surface facing in the Z2 direction. The thickness direction of the wall 80c corresponds to the Z axis direction. When viewed in the Z axis direction, the wall 80c is located in the Y2 direction and the Z1 direction relative to the wall 80a. The end in the Z2 direction of the opening 55A is located in the Z2 direction relative to the end in the Z2 direction of the connector 46A. The end in the Z2 direction of the opening 55B is located in the Z2 direction relative to the end in the Z2 direction of the connector 46B.

As illustrated in FIG. 8, the cover 21 has a rib 28. The rib 28 protrudes from the wall 80c of the cover 21 in the Z1 direction. The thickness direction of the rib 28 corresponds to the Y axis direction. The rib 28 extends in the X axis direction. The connectors 46A and 46B are located in the Y2 direction relative to the rib 28.

Next, a flexible member 65 will be described. The head unit 20 includes the flexible member 65. As illustrated in FIG. 8, the flexible member 65 is located in the housing space S10 of the housing 23 of the head unit 20. The housing space S10 has the first space S11 including the connectors 46A and 46B and the openings 55A and 55B and the second space S12 larger than the first space S11. The flexible member 65 separates the housing space S10 into the first space S11 and the second space S12. The term "separate" does not always mean "completely separate." For example, the term "separate" may refer to a case where a small gap is formed between the first space S11 and the second space S12, but resistance generated there prevents mist and paper dust from moving through the gap. Here, "the first space S11 including the openings 55A and 55B" means that the edges of the openings 55A and 55B define the first space S11.

The rib 28 of this embodiment is located between the first space S11 and the second space S12. The first space S11 is located in the Y2 direction relative to the rib 28. The second space S12 is located in the Y1 direction relative to the rib 28. The flexible member 65 is sandwiched between the rib 28 and the relay board 41 in the Z axis direction. The flexible member 65 is located on the surface 41a of the relay board 41 and is located in the Z1 direction relative to the rib 28. The circuit elements 48 are located in the second space S12 and no circuit elements 48 are in the first space S11. When viewed in the Z axis direction, the flexible member 65 may overlap the circuit element(s) 48.

As illustrated in FIG. 5, the flexible member 65 extends in a straight line along the border between the protrusion 41d and the body 41c when viewed in the Z axis direction. When viewed in the Z axis direction, the flexible member 65 overlaps the border line between the protrusion 41d and the body 41c. The flexible member 65 extends along both the connectors 46A and 46B in the X axis direction and is longer than the protrusion 41d.

As illustrated in FIG. 8, the flexible member 65 separates the first space S11 and the second space S12 together with the rib 28. The flexible member 65 should not be limited to one separating the first space S11 and the second space S12 together with the rib 28. For example, the flexible member 65 may be located away from the rib 28 when viewed in the Z axis direction, and the first space S11 and the second space S12 may be separated by only the flexible member 65.

Furthermore, the first space S11 does not have to accommodate the entire connectors 46A and 46B. For example, the first space S11 may include the opening 55A and at least a portion of the connector 46A. In other words, the end in the Z2 direction of the connector 46A may extend through the opening 55A to the outside of the cover 21. Similarly, the first space S11 may include the opening 55B and at least a portion of the connector 46B. Furthermore, the first space S11 may include the openings 55A and 55B, at least a portion of the connector 46A, and at least a portion of the connector 46B.

Furthermore, the housing space S10 may include multiple first spaces S11. For example, the housing space S10 may include a first space S11 that includes at least a portion of the connector 46A and the opening 55A, a first space S11 that includes at least a portion of the connector 46B and the opening 55B, and the second space S12. When the housing space S10 includes the multiple first spaces S11 in this way, the second space S12 may have a volume larger than the total of the volumes of the first spaces S11. The second space S12 may have a larger volume than one of the first spaces S11 that has the largest volume.

The flexible member 65 has elasticity and can change the shape when compressed. The flexible member 65 can change the shape when sandwiched between the rib 28 and the relay board 41. The flexible member 65 can seal the gap between the rib 28 and the relay board 41 when compressed by the rib 28 in the Z1 direction. The flexible member 65 can reduce passage of mist and paper dust. The mist may be generated when the ink ejected from the liquid ejecting head 10 separates. The paper dust may be generated when a portion of the medium PA is broken down to fine pieces.

The flexible member 65 may be a SARCON sheet having insulating properties. The SARCON sheet is a registered trademark. The SARCON sheet is a sheet formed of silicone having thermal conductivity, electrical insulation and flame retardancy. The flexible member 65 that has electrical insulating properties is less likely to cause a problem even when brought in contact with, for example, a metal wiring line of the relay board 41 or the circuit element 48.

The flexible member 65 may be formed of elastomer, for example. The flexible member 65 may be formed of any other resin or rubber.

The thermal conductivity of the flexible member 65 may be greater than or equal to 1.0 W/m·K. When the thermal conductivity of the flexible member 65 is greater than or equal to 1.0 W/m·K, the heat of the relay board 41 can be transmitted to the cover 21 through the flexible member 65.

Furthermore, when the flexible member 65 is located over a portion of the circuit element 48, the flexible member 65 is preferably a gel type or a putty type silicone sheet to conform to the uneven outer shape of the circuit element 48. The flexible member 65 may be a rubber type silicone sheet. The flexible member 65 that is a gel type or putty type silicone sheet can better conform to the shape of the circuit element 48 than one that is a rubber type silicone sheet.

Next, with reference to FIG. 6, a duct 93 and a fan 94 coupled to the outlet 92 of the cover 21 will be described. The duct 93 and the fan 94 are coupled to the outlet 92 of the cover 21. The duct 93 extends from the outlet 92 in the Y1 direction. The fan 94 is located in the Y1 direction relative to the duct 93. The fan 94 draws the air into the cover 21. As described above, the air entered the cover 21 through the inlet 91 flows in the X2 direction to be discharged through the outlet 92 into the duct 93. The air in the duct 93 is discharged through the fan 94 to the outside.

The housing space S10 of the cover 21 is separated into the first space S11 and the second space S12 by the flexible member 65, and thus the air is less likely to flow from the first space S11 to the second space S12. Thus, foreign substances such as mist and paper dust in the first space S11 is less likely to enter the second space S12.

Furthermore, the flexible member 65 is located so as not to be come in contact with the electrical wiring lines 49A and 49B when the electrical wiring lines 49A and 49B, which are external wiring members, are coupled to the connectors 46A and 46B. Thus, when the electrical wiring lines 49A and 49B are coupled to the connectors 46A and 46B, the flexible member 65 is not an obstacle, and thus the head unit 20 has a higher insertion/extraction operability of the electrical wiring lines 49A and 49B.

As described above, the head unit 20 according to the embodiment includes the connectors 46A and 46B to be coupled to the external electrical wiring lines 49A and 49B. The head unit 20 includes the relay board 41 having the connectors 46A and 46B, the housing 23 for the head unit 20, the housing 23 having the openings 55A and 55B through which the connectors 46A and 46B are exposed outside and having the housing space S10 that accommodates the relay board 41, and the flexible member 65 in the housing space S10. The flexible member 65 separates the housing space S10 into the first space S11 that has at least a portion of the connector 46 and the openings 55A and 55B and the second space S12 that is larger than the first space S11.

In the head unit 20 having such a configuration, the flexible member 65 located near the connectors 46A and 46B reduces entry of mist and paper dust, and the flexible member 65 not covering the openings 55A and 55B does not lower the insertion/extraction operability of the external electrical wiring lines 49A and 49B. Although mist is likely to gather around the connectors 46A and 46B due to the Lenard effect, entry of mist into the second space S12 is effectively reduced because the flexible member 65 isolates the first space S11 having the connectors 46A and 46B. The volume of the second space S12 is preferably at least five times as large as the volume of the first space S11, more preferably at least ten times as large as the volume of the first space S11. This allows the first space S11 for the connectors 46A and 46B to be small, and thus an increase in the size of the relay board 41 is reduced.

The relay board 41 defines the first space S11 and the second space S12. The portion of the relay board 41 that defines the first space S11 have no circuit elements 48 and the portion of the relay board 41 that defines the second space S12 has at least one circuit element 48.

In the head unit 20 having such a configuration, the first space S11 does not have the circuit element 48. This reduces the possibility that mist and paper dust will come in contact with the circuit element 48 even when mist and paper dust enter the first space S11 through the openings 55A and 55B. Furthermore, in the head unit 20, the circuit element 48 is located in the second space S12, and the flexible member 65 separates the first space S11 and the second space S12 from each other. This configuration reduces entry of mist and paper dust into the second space S12 from the first space S11, and thus the circuit element 48 in the second space S12 is protected. Thus, the head unit 20 is less likely to be adversely affected by mist and paper dust in contact with the circuit element 48. Here, "a portion of the relay board 41 that defines the first space S11" is a portion of the surface 41a of the relay board 41 that faces the first space S11, and "a portion of the relay board 41 that defines the second space S12" is a portion of the surface 41a of the relay board 41 that faces the second space S12.

The connectors 46A and 46B are stacked on the surface 41a of the relay board 41, the housing 23 includes the base member 22 and the cover 21 stacked on the base member 22. The cover 21 has the rib 28 protruding toward the surface 41a from the wall 80c of the cover 21 defining the housing space S10. The flexible member 65 is sandwiched between the surface 41a of the relay board 41 and the rib 28.

In the head unit 20 having such a configuration, the cover 21 is stacked on the base member 22. This allows easy detachment of the cover 21 from the base member 22. The cover 21 is mounted on the base member 22 and screwed to it, and thus detachment of the cover 21 from the base member 22 is easy. The gap between the cover 21 and the base member 22 may be substantially 0 mm in the Z axis direction in which the cover 21 is stacked on the base member 22. Specifically, the gap exists between the end surface 22c of the frame 22a of the base member 22 and the cover 21. Furthermore, as can be understood from FIG. 5, the gap extends over the entire circumference or substantially entire circumference of the circuit board portion 40 when viewed in the Z axis direction. The gap is within a tolerance including a manufacturing error and is a minor gap. Thus, the gap is unlikely to allow mist and paper dust to enter the housing space S10.

Furthermore, in the head unit 20 according to this embodiment, the flexible member 65 is employed to prevent mist and paper dust in the first space S11 from entering the second space S12. This allows easier detachment of the cover 21 from the base member 22 than a configuration in which a filler such as an adhesive separates the housing space S10 into the first space S11 and the second space S12, for example, instead of the flexible member 65. When the cover 21 is fixed to the base member 22 with an adhesive, the cover 21 is not readily detached. However, in the head unit 20 of this embodiment, the cover 21 is fixed to the base member 22 without an adhesive, and thus the cover 21 is readily detached.

The relay board 41 has the surface 41b opposite the surface 41a, and the surface 41b of the relay board 41 is stacked on the base member 22 to separate the first space S11 and a space of the housing space S10 having the surface 41b.

In the head unit 20, the third space S13 located in the Z1 direction relative to the surface 41b of the relay board 41 has the liquid ejecting heads 10 and the common passage member 30. The relay board 41 is in contact with the base member 22 at the entire outer edge except for a portion near the joint to the common passage member 30. The gap between the relay board 41 and the base member 22 may be substantially 0 mm. The gap is within a tolerance including a manufacturing error and is a minor gap. The gap between the relay board 41 and the base member 22 is small, and mist and paper dust are unlikely to enter the first space S11 and the second space S12 through the gap. Even if the gap between the relay board 41 and the base member 22 allows entry of mist and paper dust, the amount of mist and paper dust is negligible to the object of reducing the entry of mist and paper dust into the second space S12.

The head unit 20 of this embodiment reduces entry of mist and paper dust into the first space S11 and the second space S12, which are located above the relay board 41, from the space located in the Z1 direction relative to the surface 41b of the relay board 41.

When the relay board 41 is viewed in plan view, the relay board 41 includes the body 41c and the protrusion 41d protruding from the body 41c. The protrusion 41d has the connectors 46A and 46B. The protrusion 41d defines the first space S11, and the body 41c defines the second space S12. The flexible member 65 extends in a straight line along the border between the protrusion 41d and the body 41c in plan view.

The head unit 20 having such a configuration includes the straight flexible member 65, and thus the flexible member 65 can have a simple shape and a small size. The flexible member 65 is slightly longer in the X axis direction than the protrusion 41d and is sufficiently shorter in the X axis direction than the body 41c. The flexible member 65 is shorter in the X axis direction than the body 41c of the relay board 41 preferably by less than or equal to 50%, more preferably by less than or equal to 30%.

The flexible member 65 should not be limited to one extending in a straight line. In particular, when the relay board 41 includes only the body 41c having a substantially rectangular shape without the protrusion 41d included in the present embodiment, the flexible member 65 may have an angular U-like shape, an L-like shape, or a U-like shape. In contrast to the flexible member 65 extending in a straight line, such a flexible member 65 can reduce an increase in the size of the flexible member 65 while separating the first space S11 and the second space S12.

The housing 23 has the inlet 91 through which external air is drawn into the second space S12 and the outlet 92 through which the air in the second space S12 is discharged outside. The openings 55A and 55B are on an opposite side of the flexible member 65 from the outlet 92 in a widthwise direction of the relay board 41 perpendicular to a lengthwise direction. In this embodiment, the lengthwise direction of the relay board 41 corresponds to the X axis direction, and the widthwise direction corresponds to the Y axis direction. Only at least a portion of the openings 55A and 55B needs to overlap the outlet 92 in the Y axis direction.

In the head unit 20 having such a configuration, an airstream flowing in the Y1 direction toward the outlet 92 can make gas containing mist and paper dust to be easily drawn into the first space S11 through the openings 55A and 55B. However, in the head unit 20 according to this embodiment, the flexible member 65 that separates the first space S11 and the second space S12 reduces entry of gas into the second space S12 from the first space S11.

Furthermore, in the head unit 20, the inlet 91 is located away in the X axis direction from a print area of the liquid ejecting heads 10. The print area is narrower in the X axis direction than the width of the medium PA in the X axis direction. This reduces the possibility that mist and paper dust will enter the second space S12 through the inlet 91.

Furthermore, in the head unit 20, the housing space S10 is separated by the relay board 41 in the Z axis direction. When the Z axis direction corresponds to the direction of gravity, the housing space S10 is separated into upper and lower spaces by the relay board 41. The connectors 46A and 46B and the outlet 92 are in the housing space S10 that is closer to the surface 41a of the relay board 41 than to the surface 41b, among the housing spaces S10 separated by the relay board 41. In the head unit 20 having such a configuration, the flexible member 65 is located between the first space S11 and the second space S12, and thus the air in the first space S11 having the openings 55A and 55B is less likely to enter the second space S12 having the outlet 92. This reduces entry of mist and paper dust into the second space S12.

Furthermore, the liquid ejecting apparatus 1 includes the head unit 20 and the external electrical wiring lines 49A and 49B located outside the head unit 20 and coupled to the connectors 46A and 46B.

Furthermore, the liquid ejecting apparatus 1 includes the fan 94 adjacent to the outlet 92. The fan 94 is configured to cool the relay board 41 in the housing space S10. The position adjacent to the outlet 92 means a position closer to the outlet 92 than to the inlet 91. The fan 94 may be located close to the inlet 91. For example, the fan 94 may be located in the X1 direction relative to the inlet 91.

2. Second Embodiment

Figure 9:
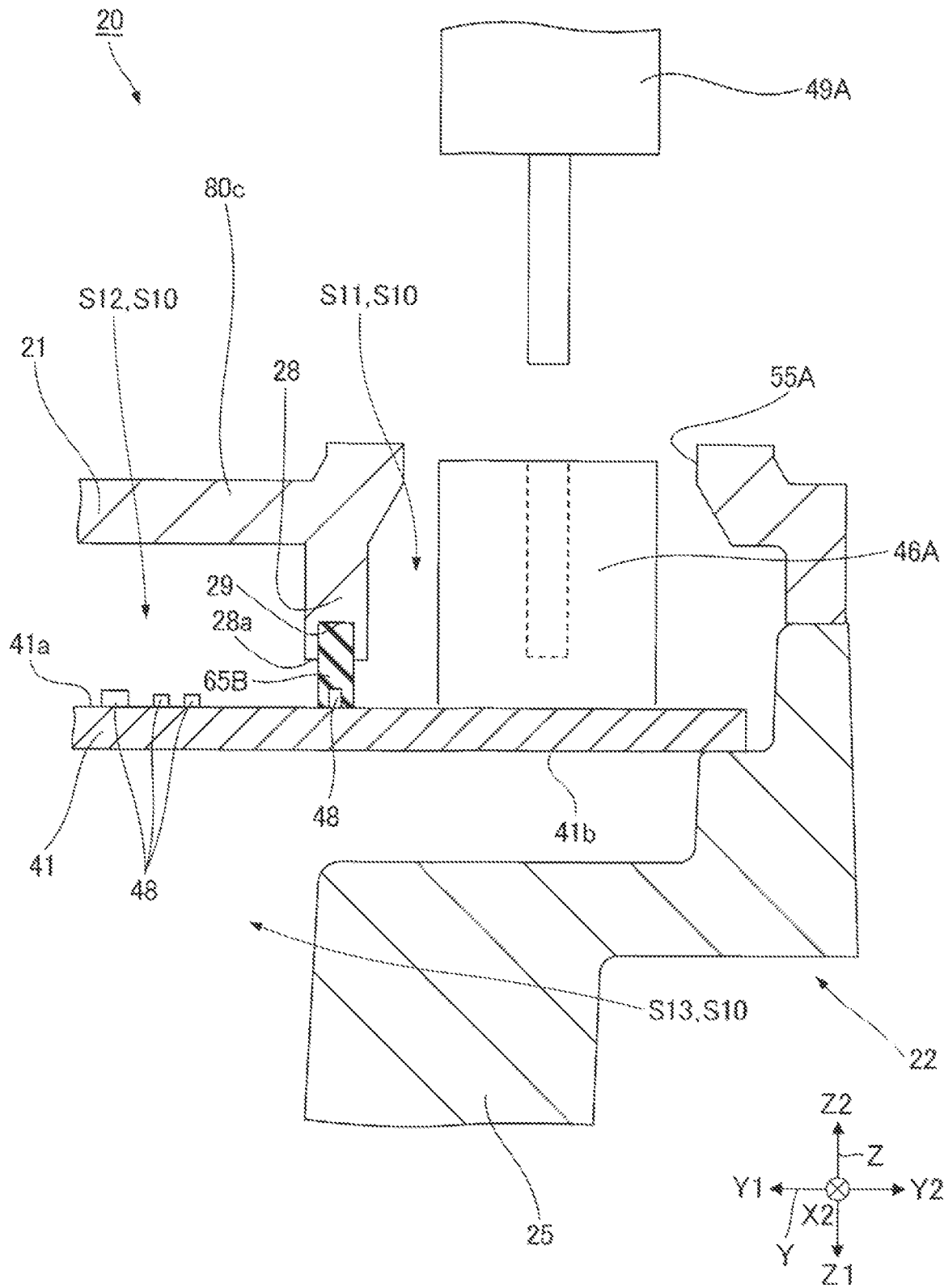
FIG. 9 is a magnified cross-sectional view illustrating main components of a head unit according to a second embodiment.

Next, a head unit 20 according to a second embodiment will be described with reference to FIG. 9. FIG. 9 is a magnified cross-sectional view illustrating main components of the head unit 20 according to the second embodiment. The head unit 20 according to the second embodiment differs from the head unit 20 according to the first embodiment in that the rib 28 of the cover 21 has a recess 29 in the distal end surface 28a and a portion of the flexible member 65B is in the recess 29. In the description of the second embodiment, the same explanations as those given in the first embodiment will not be given in some cases.

The cover 21 includes the rib 28 having the recess 29 in the distal end surface 28a. The distal end surface 28a faces in the Z1 direct ion. The distal end surface 28a is located in the Z2 direction relative to the surface 41a of the relay board 41. The recess 29 is recessed from the distal end surface 28a in the Z2 direction. The recess 29 extends continuously in the X axis direction. Although not illustrated, the flexible member 65B is preferably surrounded by the inner wall surface of the recess 29 over the entire circumference when viewed in the Z axis direction, which corresponds to the direction in which the rib 28 protrudes. The length of the recess 29 in the X axis direction is substantially the same as the length of the flexible member 65B in the X axis direction. All that is required for the recess 29 is to hold the flexible member 65B.

The head unit 20 includes a flexible member 65B. The flexible member 65B is located between the first space S11 and the second space S12. The flexible member 65B and the rib 28 separate the first space S11 and the second space S12 from each other.

A portion of the flexible member 65B is in the recess 29, and a portion of the flexible member 65B protrudes from the distal end surface 28a in the Z1 direction.

The distal end surface 28a of the rib 28 has the recess 29 extending in a direction away from the surface 41a. The flexible member 65B is located in the recess 29 of the rib 28 to have a portion protruding from the distal end surface 28a of the rib 28.

In the head unit 20 according to the second embodiment, displacement of the flexible member 65B is reduced, because the position of the flexible member 65B is fixed relative to the distal end surface 28a of the rib 28. Furthermore, when the cover 21 is detached from the base member 22, the base member 22 can be detached together with the cover 21. This allows easy replacement of the cover 21. When the cover 21 is attached to the base member 22, the flexible member 65B can be located together with the cover 21.

The tackiness of the surface of the flexible member 65B in contact with the rib 28 is preferably larger than the tackiness of the surface of the flexible member 65B in contact with the surface 41a of the relay board 41. The tackiness may refer to the ability of the flexible member 65B to resist separation from a surface of another member. The flexible member 65B having a large tackiness is less separable from another member than one having a small tackiness.

The flexible member 65B may be integrally formed with the rib 28, for example, by a double molding process.

3. Third Embodiment

Figure 10:
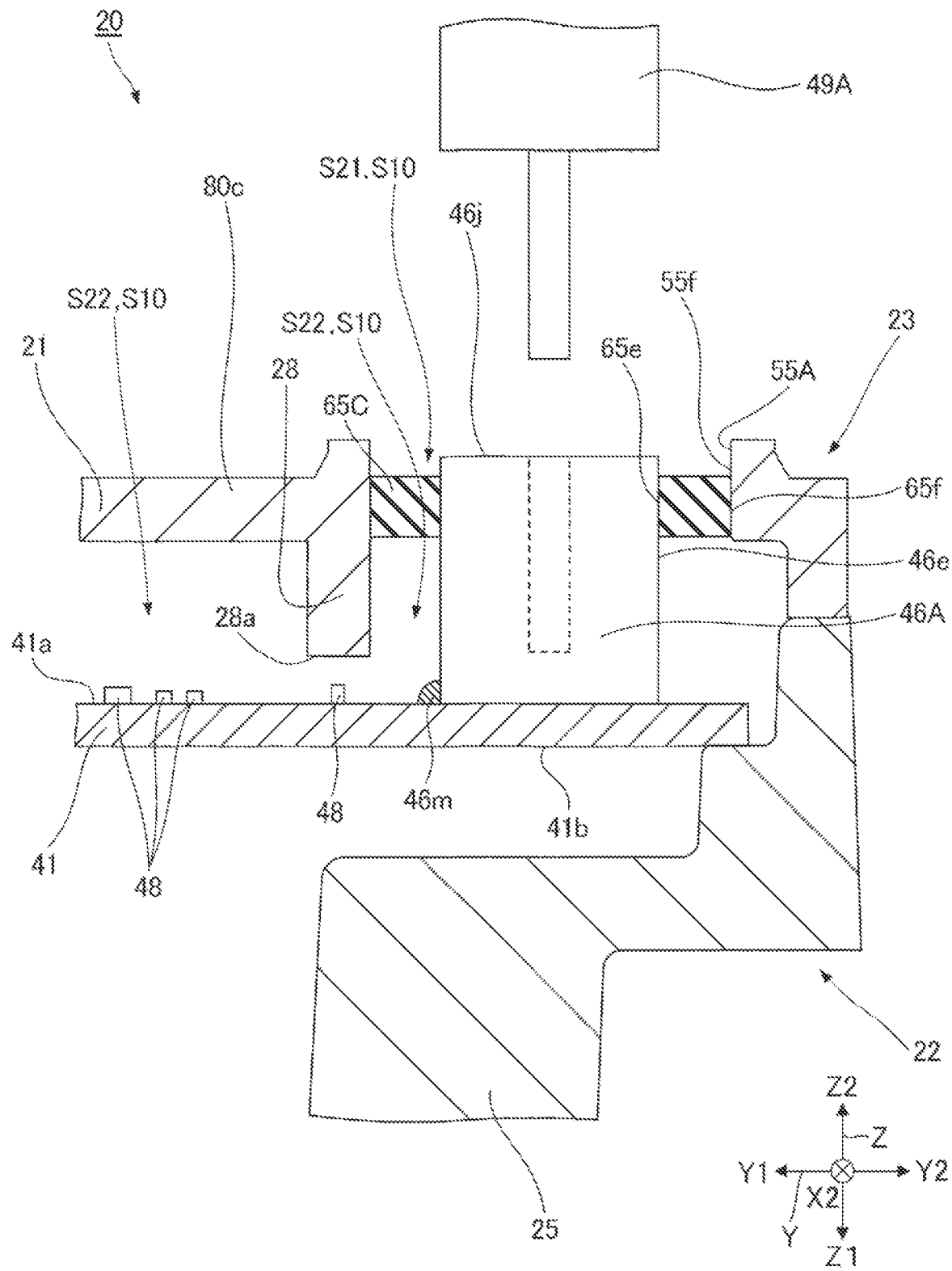
FIG. 10 is a magnified cross-sectional view illustrating main components of a head unit according to a third embodiment.
Figure 11:
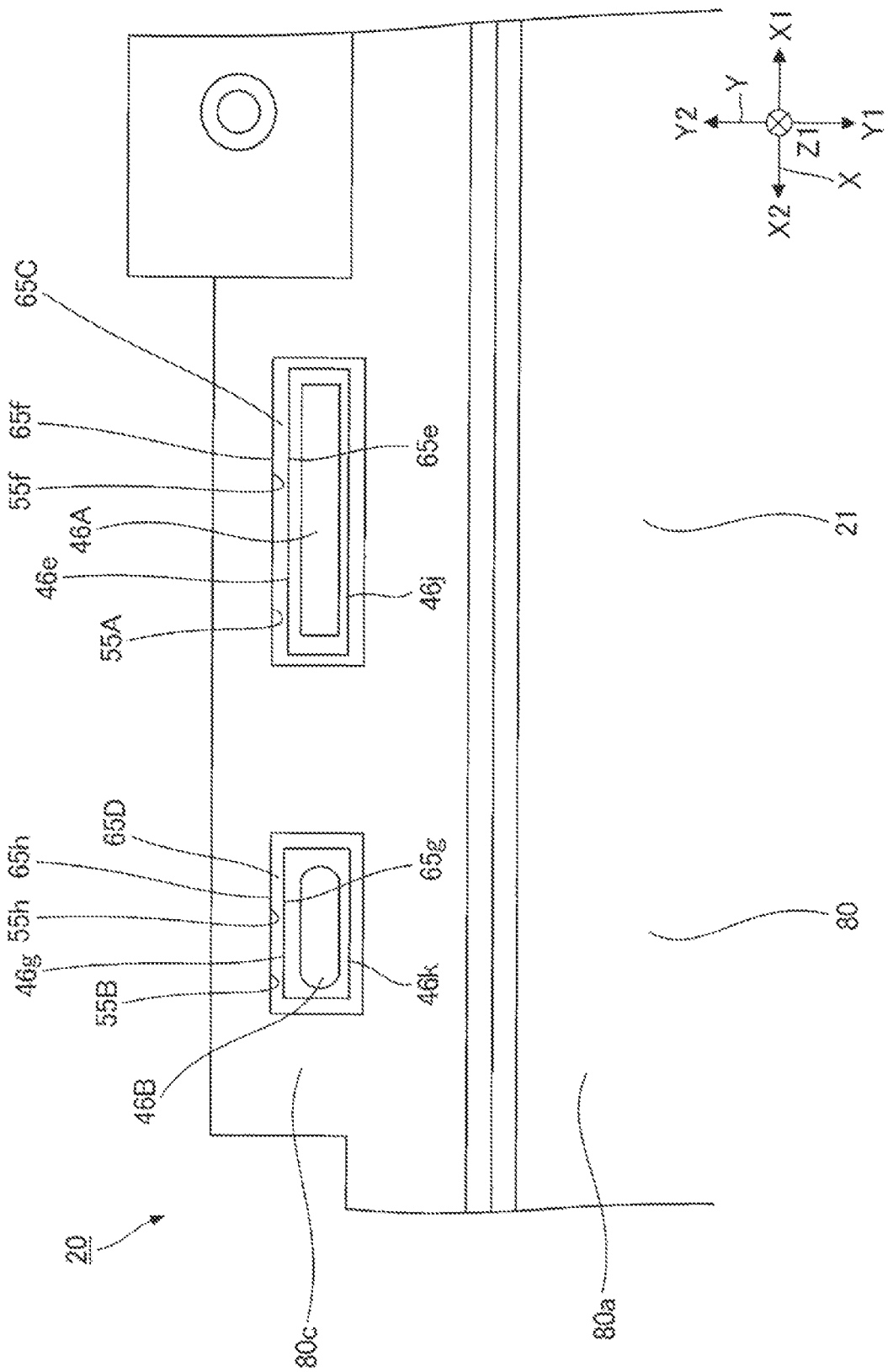
FIG. 11 is a magnified plan view illustrating openings in the cover and connectors exposed through the openings.

Next, a head unit 20 according to a third embodiment will be described with reference to FIGS. 10 and 11. FIG. 10 is a magnified cross-sectional view illustrating main components of the head unit 20 according to the third embodiment. FIG. 11 is a magnified plan view illustrating openings in the cover and connectors exposed through the openings. The head unit 20 according to the third embodiment differs from the head unit 20 according to the first embodiment in positions of flexible members 65C and 65D and in the ranges of the first and second spaces S21 and S22. In the description of the third embodiment, the same explanations as those given in the first embodiment will not be given in some cases.

The head unit 20 includes the flexible members 65C and 65D. The flexible member 65C is located around the connector 46A, and the flexible member 65D is located around the connector 46B. The flexible members 65C and 65D each have a rectangular frame-like shape when viewed in the Z axis direction. The flexible member 65C has an inner circumferential surface 65e in contact with an outer circumferential surface 46e of the connector 46A. The flexible member 65C has an outer circumferential surface 65f in contact with an inner circumferential surface 55f of the opening 55A. The flexible member 65D has an inner circumferential surface 65g in contact with an outer circumferential surface 46g of the connector 46B. The flexible member 65D has an outer circumferential surface 65h in contact with an inner circumferential surface 55h of the opening 55B.

The flexible members 65C and 65D each have a thickness in the Z axis direction. The openings 55A and 55B may have a length in the Z axis direction. The flexible member 65C is located away in the Z1 direction from an end surface 46j of the connector 46A, which is located at the end in the Z2 direction. The flexible member 65D is located away in the Z1 direction from an end surface 46k of the connector 46B, which is located at the end in the Z2 direction. The flexible members 65C and 65D are positioned not to be an obstacle to attaching the external electrical wiring lines 49A and 49B to the connectors 46A and 46B. The flexible members 65C and 65D are not located in the Z2 direction relative to the connectors 46A and 46B.

The flexible members 65C and 65D separate the housing space S10 into a first space S21 and a second space S22. In the Z axis direction, the first space S21 includes a space located in the Z2 direction relative to the flexible members 65C and 65D. The second space S22 includes a space located in the Z1 direction relative to the flexible members 65C and 65D. The first space S21 includes at least a portion of the connectors 46A and 46B and the openings 55A and 55B. The first space S21 includes a space including at least a portion of the connector 46A and the opening 55A and a space including at least a portion of the connector 46B and the opening 55B. The first space S21 may include multiple separated spaces.

The head unit 20 according to the third embodiment does not include the flexible member 65 between the distal end surface 28a of the rib 28 and the surface 41a of the relay board 41 but may further include the flexible member 65 between the rib 28 and the relay board 41. The flexible members 65C and 65D are located away from the surface 41a of the relay board 41 in the Z axis direction. However, the flexible members 65C and 65D may be in contact with the outer circumferential surfaces 46e and 46g of the connectors 46A and 46B and the surface 41a of the relay board 41.

The flexible member 65C is sandwiched between the inner circumferential surface 55f of the opening 55A and the outer circumferential surface 46e of the connector 46A. The flexible member 65D is sandwiched between the inner circumferential surface 55h of the opening 55B and the outer circumferential surface 46g of the connector 46B. The head unit 20 may include the flexible members 65C and 65D having such a configuration. The head unit 20 according to the third embodiment exhibits the operation and effect similar to those of the head unit 20 according to the first embodiment.

The opening 55A is a though hole in the housing 23. When viewed in a direction in which the external electrical wiring line 49A is inserted into the connector 46A, the flexible member 65C is sandwiched between the entire inner circumferential surface 55f of the opening 55A and the entire outer circumferential surface 46e of the connector 46A. The opening 55B is a through hole in the housing 23. When viewed in a direction in which the external electrical wiring line 49B is inserted into the connector 46B, the flexible member 65D is sandwiched between the entire inner circumferential surface 55h of the opening 55B and the entire outer circumferential surface 46g of the connector 46B. "The entire inner circumferential surface 55f" and "the entire inner circumferential surface 55h" include the entire circumferences viewed in the Z axis direction. "The entire outer circumferential surface 46e" and "the entire outer circumferential surface 46g" include the entire circumferences viewed in the Z axis direction. The sentence "the electrical wiring line 49A is inserted into the connector 46A" includes that the electrical wiring line 49A and the connector 46A are electrically coupled to each other. The sentence "the electrical wiring line 49B is inserted into the connector 46B" includes that the electrical wiring line 49B and the connector 46B are electrically coupled to each other. The direction in which the electrical wiring line 49A is inserted into the connector 46A corresponds to the Z axis direction. The direction in which the electrical wiring line 49B is inserted into the connector 46B corresponds to the Z axis direction.

The head unit 20 having such a configuration reduces entry of mist and paper dust into the second space S22, which is located on an opposite side of the flexible members 65C and 65D from the openings 55A and 55B. For example, when terminals 46m of the connectors 46A and 46B are on the surface 41a of the relay board 41, the terminals 46m are in the second space S22. In the head unit 20 according to the third embodiment, the flexible members 65C and 65D reduce entry of air into the second space S22 from the first space S21. This reduces the possibility that mist and paper dust will attach to the terminals 46m of the connectors 46A and 46B in the second space S22. Although FIG. 10 illustrates only the terminal 46m of the connector 46A, the same is applicable to the terminal 46m of the connector 46B.

4. Fourth Embodiment

Figure 12:
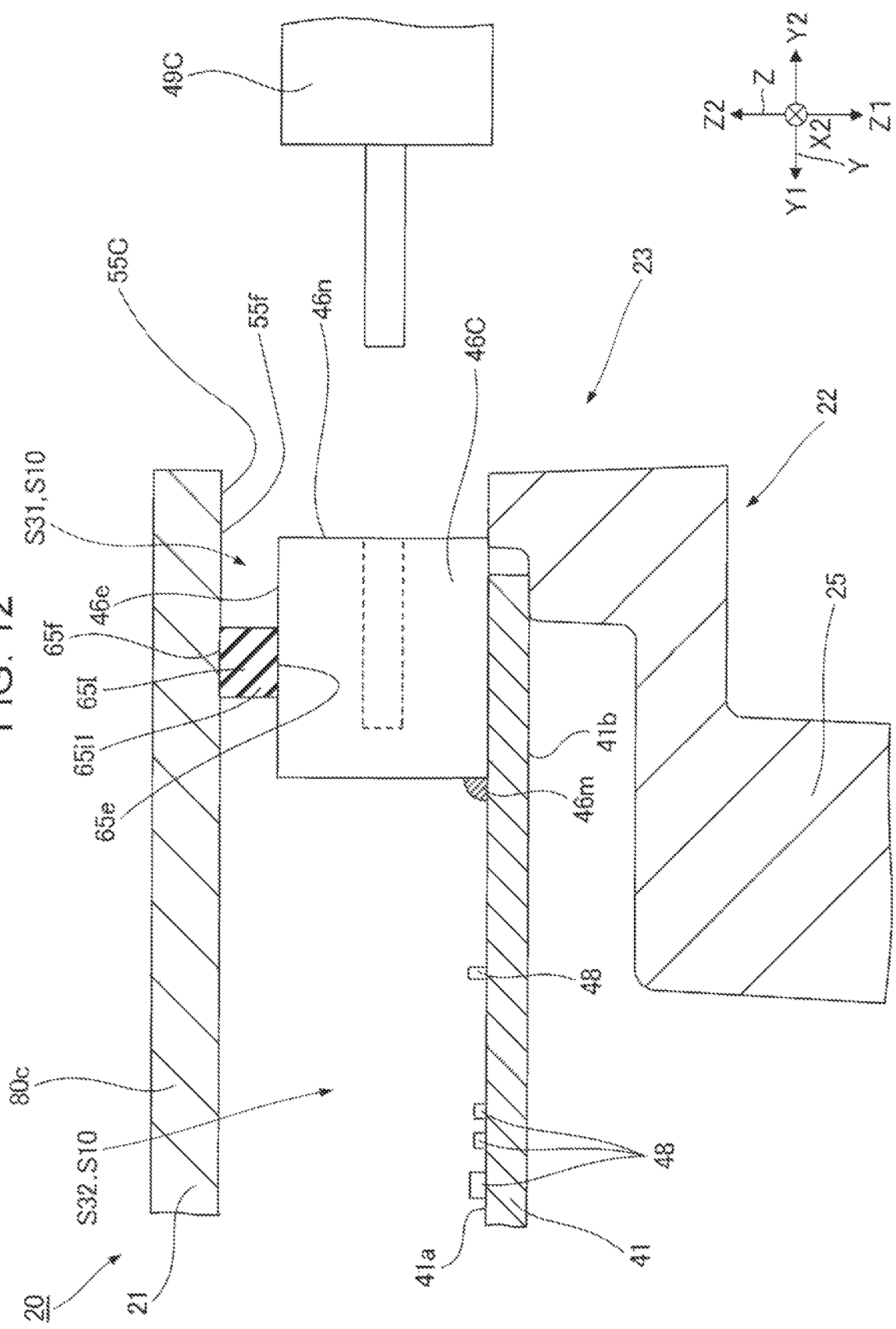
FIG. 12 is a magnified cross-sectional view illustrating main components of a head unit according to a fourth embodiment.
Figure 13:
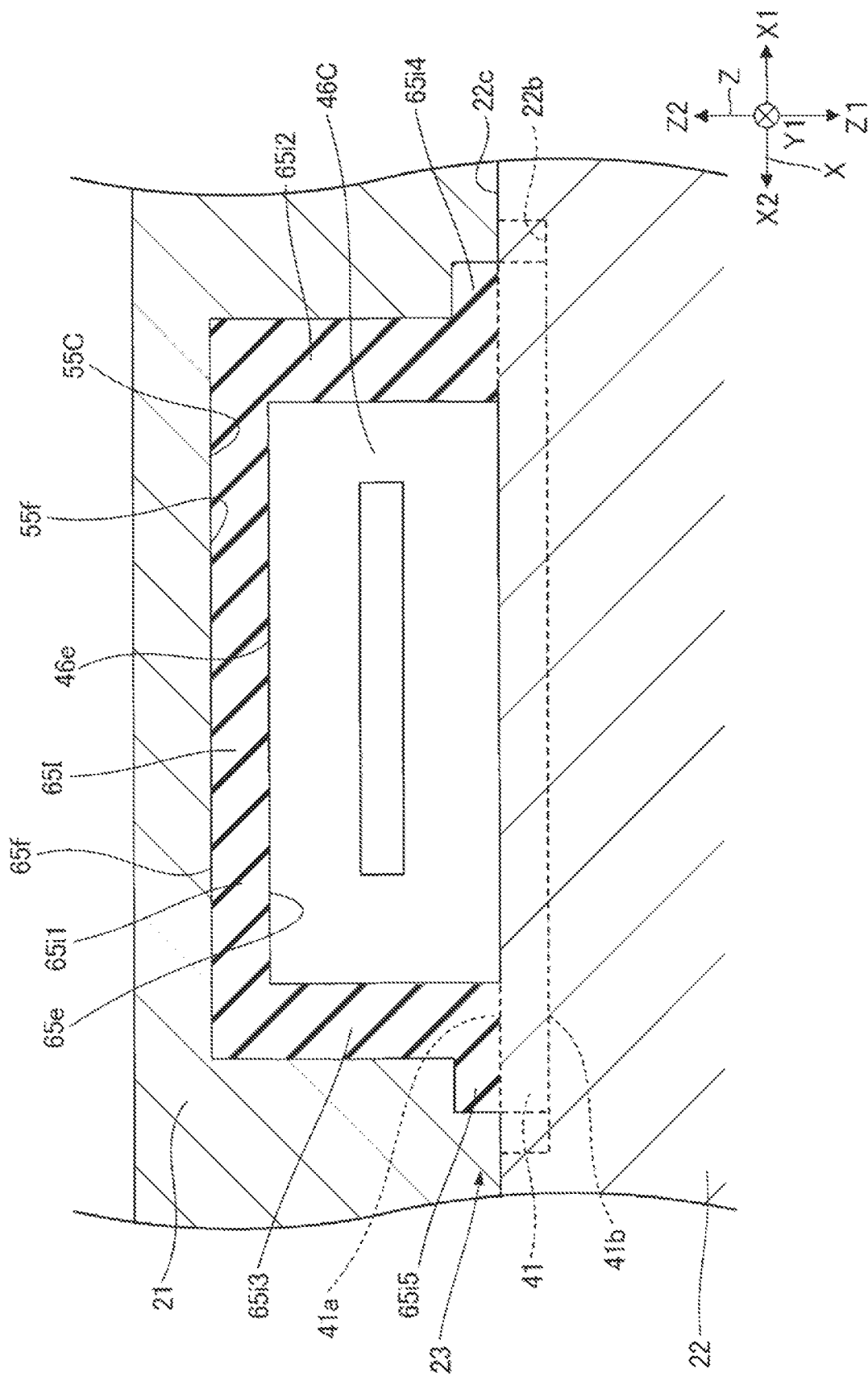
FIG. 13 is a magnified cross-sectional view illustrating an opening in the cover and a connector exposed through the opening.

Next, a head unit 20 according to a fourth embodiment will be described with reference to FIGS. 12 and 13. FIG. 12 is a magnified cross-sectional view illustrating main components of the head unit 20 according to the fourth embodiment. FIG. 13 is a magnified plan view illustrating an opening 55C in the cover 21 and a connector 46C exposed through the opening 55C. The head unit 20 according to the fourth embodiment differs from the head unit 20 according to the first embodiment in the position of the connector 46C, the position of the opening 55C, and the position of the flexible member 65I, and the ranges of the first and second spaces S31 and S32. In the description of the fourth embodiment, the same explanations as those given in the first, second, or third embodiment will not be given in some cases.

The head unit 20 includes a connector 46C. The connector 46C is coupled to an electrical wiring line 49C. The connector 46C has an opening to which the external electrical wiring line 49C is inserted in the surface facing in the Y2 direction. The direction in which the electrical wiring line 49C is inserted into the connector 46C corresponds to the Y axis direction. The electrical wiring line 49C is moved in the Y1 direction to couple the electrical wiring line 49C to the connector 46C.

The cover 21 has an opening 55C through which the connector 46C is exposed to the outside. The opening 55C is located in the Y2 direction relative to the connector 46C.

The head unit 20 includes a flexible member 65I. The flexible member 65I is located around the connector 46C. The flexible member 65I includes, when viewed in the Y axis direction, a portion 65i1 extending in the X axis direction, portions 65i2 and 65i3 extending in the Z1 direction from the ends in the X axis direction of the portion 65i1, a portion 65i4 extending in the X1 direction from the end in the Z1 direction of the portion 65i2, and a portion 65i5 extending in the X2 direction from the end in the Z1 direction of the portion 65i3. When viewed in the Y axis direction, the portion 65i1 is located in the Z2 direction relative to the connector 46C, the portion 65i2 is located in the X1 direction relative to the connector 46C, and the portion 65i3 is located in the X2 direction relative to the connector 46C. The surface of the connector 46C facing in the Z1 direction is in contact with the surface 41a of the relay board 41. This eliminates the need of the flexible member 65I located in the Z1 direction relative to the connector 46C.

The inner circumferential surface 65e of the flexible member 65C, specifically the inner circumferential surfaces 65e of the portions 65i1, 65i2, and 65i3 are in contact with the outer circumferential surface 46e of the connector 46C. The outer circumferential surface 65f of the flexible member 65C is in contact with the inner circumferential surface 55f of the opening 55C.

The flexible member 65I has a thickness in the Y axis direction. The opening 55C may have a length in the Y axis direction. The flexible member 65I is located away in the Y1 direction from an end surface 46n located at the end in the Y2 direction of the connector 46C. The flexible member 65I is positioned not to be an obstacle to attaching the external electrical wiring lines 49C to the connector 46C. The flexible member 65I is not located in the Y2 direction relative to the connector 46C.

The flexible member 65I separates the housing space S10 into the first space S31 and the second space S32. In the Y axis direction, the first space S31 includes a space located in the Y2 direction relative to the flexible member 65I. The second space S32 includes a space located in the Y1 direction relative to the flexible member 65I. The first space S31 includes at least a portion of the connector 46C and the opening 55C.

The flexible member 65I is sandwiched between the inner circumferential surface 55f of the opening 55C and the outer circumferential surface 46e of the connector 46C. The head unit 20 may include such a flexible member 65I. The head unit 20 according to the fourth embodiment exhibits the operation and effect similar to those of the head unit 20 according to the first embodiment.

In the head unit 20 according to the fourth embodiment, the connector 46C is stacked on the surface 41a of the relay board 41, the housing 23 includes the cover 21 and the base member 22 stacked on the cover 21, the flexible member 65I is sandwiched between the surface 41a of the relay board 41 and the inner circumferential surface 55f of the opening 55C and between the outer circumferential surface 46e of the connector 46C and the inner circumferential surface 55f of the opening 55C.

In the head unit 20 having such a configuration, the cover 21 can be readily detached from the base member 22 by being moved in the Z2 direction. Furthermore, when the cover 21 is attached to the base member 22, the cover 21 can be readily stacked on the base member 22 by being moved in the Z1 direction. The head unit 20 according to the fourth embodiment enables easy attachment and detachment of the cover 21.

Furthermore, the opening 55C is a cutout and is open without a marginal portion in the Z1 direction.

5. Fifth Embodiment

Next, a housing 1a of the liquid ejecting apparatus 1 including the head unit 20 according to the above-described embodiment will be described. FIG. 14 is a side view illustrating the housing 1a of the liquid ejecting apparatus 1 including the head unit 20. As illustrated in FIG. 14, the head unit 20 and the medium transport mechanism 4 are accommodated in the housing 1a. The control unit 3 may also be accommodated in the housing 1a. The housing 1a has a box-like shape, for example. The housing 1a has an openable door, for example.

For example, a user opens the door to insert the electrical wiring lines 49A and 49B into the connectors 46A and 46B. The electrical wiring lines 49A and 49B, which are located outside the head unit 20 but in the housing 1a, are configured to couple the control unit 3 and the head unit 20 to each other. Furthermore, for example, a user can disconnect the wiring lines 49A and 49B from the connectors 46A and 46B to replace the head unit 20.

The liquid ejecting apparatus 1 of this embodiment includes the housing 1a that accommodates the head unit 20. The openings 55A and 55B face an inside of the housing 1a of the liquid ejecting apparatus 1. Facing inside the housing 1a means that the openings 55A and 55B are in the housing 1a when the head unit 20 is in the housing 1a.

When the liquid ejecting apparatus 1 is in use, the head unit 20 is accommodated in the housing 1a. When the ink is ejected from the liquid ejecting head 10, mist separated from the ink may float in the housing 1a. In such a case, the flexible member 65 of the head unit 20 reduces entry of air into the second space S12 from the first space S11. Thus, mist and paper dust will not adhere to the circuit element 48 in the second space S12. This can improve the reliability of the head unit 20.

Furthermore, when the electrical wiring lines 49A and 49B, which are located outside the head unit 20, are attached to or detached from the head unit 20 for maintenance, the flexible member 65 is not an obstacle. The insertion/extraction operability of the external electrical wiring lines 49A and 49B is not lowered.

6. Modifications

The above-described embodiments are merely typical embodiments of the present disclosure, and the present disclosure should not be limited to the embodiments. Various modifications and additions can be made without departing from the gist of the present disclosure.

First Modification

In the above-described embodiments, the thickness direction of the relay board 41 corresponds to the Z axis direction, but the thickness direction of the relay board 41 is not limited to the Z axis direction. The thickness direction of the relay board 41 may correspond to, for example, the X axis direction, the Y axis direction, or another direction, for example. The relay board 41 may be vertically positioned with the thickness direction corresponding to the Y axis direction.

Second Modification

In the above-described embodiments, the connectors 46A and 46B are located on the surface 41a of the relay board 41, but the connectors 46A and 46B may be located on the surface 41b of the relay board 41. For example, the connector 46A may be located on the surface 41a of the relay board 41, and the connector 46B may be located on the surface 41b of the relay board 41. The connectors 46A and 46B may be located on both the surfaces of the relay board 41.

Third Modification

In the above-described embodiments, the first space S11 and the second space S12 are located in the Z2 direction relative to the surface 41a of the relay board 41, but the first space S11 and the second space S12 may be located in the Z1 direction relative to the surface 41b of the relay board 41.

Fourth Modification

In the above-described embodiments, the head unit 20 includes one relay board 41 but may include multiple relay boards 41.

Fifth Modification

In the above-described embodiments, one opening 55A is provided for one connector 46A, but one opening may be shared by the connectors 46A and 46B. In other words, multiple connectors may be exposed through one opening.

Sixth Modification

In the above-described embodiments, the wall 80b of the cover 21 has the outlet 92, but the wall 80a of the cover 21 or a wall facing in the X2 direction may have the outlet 92.

In the above-described embodiments, the line liquid ejecting apparatus 1 including the line head 6 is described as an example. The present disclosure is also applicable to a serial liquid ejecting apparatus in which a carriage having the liquid ejecting head 10 is reciprocated in the width direction of the medium PA.

The liquid ejecting apparatus 1 illustrated in the above-described embodiments may be employed in a print-only device or other devices such as a facsimile machine and a copier. The liquid ejecting apparatus according to the present disclosure may be used for any purpose other than printing. For example, a liquid ejecting apparatus that ejects a solution of a color material may be employed in an apparatus for producing a color filter of a display device such as a liquid crystal display panel. Furthermore, a liquid ejecting apparatus that ejects a solution of a conductive material may be employed in an apparatus for producing wiring lines and electrodes on a wiring board. Furthermore, a liquid ejecting apparatus that ejects a solution of a biological organic substance may be employed in an apparatus for producing biochips.

What is claimed is:

1. A liquid ejecting head unit including a first connector configured to be coupled to an external wiring member, the liquid ejecting head unit comprising:
   a wiring board having the first connector;
   a housing for the liquid ejecting head unit, the housing having an opening through which the first connector is exposed outside and having a housing space accommodating the wiring board; and
   a flexible member in the housing space, wherein
   the flexible member separates the housing space into a first space that has at least a portion of the first connector and the opening and a second space that is larger than the first space.

2. The liquid ejecting head unit according to claim 1, wherein the wiring board defines the first space and the second space,
   a portion of the wiring board that defines the first space have no circuit elements, and
   a portion of the wiring board that defines the second space has at least one circuit element.

3. The liquid ejecting head unit according to claim 1, wherein the first connector is stacked on a first surface of the wiring board,
   the housing includes a first member and a second member stacked on the first member,
   the second member has a rib protruding toward the first surface from a wall defining the housing space, and
   the flexible member is sandwiched between the first surface of the wiring board and the rib.

4. The liquid ejecting head unit according to claim 3, wherein the wiring board has a second surface opposite the first surface, and the second surface of the wiring board is stacked on the first member to separate the housing space into the first space and a space having the second surface.

5. The liquid ejecting head unit according to claim 3, wherein a distal end surface of the rib has a recess extending in a direction away from the first surface, and
the flexible member is located in the recess of the rib to have a portion protruding from the distal end surface of the rib.

6. The liquid ejecting head unit according to claim 1, wherein the flexible member is sandwiched between an inner circumferential surface of the opening and an outer circumferential surface of the first connector.

7. The liquid ejecting head unit according to claim 6, wherein the opening is a through hole in the housing, and
when viewed in a direction in which the external wiring member is inserted into the first connector, the flexible member is sandwiched between an entire inner circumferential surface of the opening and an entire outer circumferential surface of the first connector.

8. The liquid ejecting head unit according to claim 6, wherein the first connector is stacked on a first surface of the wiring board,
the housing includes a first member and a second member stacked on the first member, and
the flexible member is sandwiched between the first surface of the wiring board and the inner circumferential surface of the opening and between an outer circumferential surface of the first connector and the inner circumferential surface of the opening.

9. The liquid ejecting head unit according to claim 1, further comprising a second connector to be coupled to an external wiring member, wherein
the wiring board has the second connector exposed outside through the opening, and
the flexible member defines the first space to have at least a portion of the second connector.

10. The liquid ejecting head unit according to claim 1, wherein, when the wiring board is viewed in plan view, the wiring board includes a body and a protrusion protruding from the body, and
the protrusion has the first connector,
the protrusion defines the first space,
the body defines the second space, and
the flexible member extends in a straight line along a border between the protrusion and the body when viewed in plan view.

11. The liquid ejecting head unit according to claim 1, wherein the flexible member has insulating properties.

12. The liquid ejecting head unit according to claim 1, wherein the housing has an inlet through which external air is drawn into the second space and an outlet through which air in the second space is discharged outside, and
the opening is on an opposite side of the flexible member from the outlet in a widthwise direction of the wiring board perpendicular to a lengthwise direction.

13. A liquid ejecting apparatus comprising:
the liquid ejecting head unit according to claim 12; and
an external wiring member located outside the liquid ejecting head unit and coupled to the first connector.

14. The liquid ejecting apparatus according to claim 13, further comprising a fan adjacent to the outlet, wherein
the fan is configured to cool the wiring board located in the housing space.

15. A liquid ejecting apparatus comprising:
the liquid ejecting head unit according to claim 1; and
an external wiring member located outside the liquid ejecting head unit and coupled to the first connector.

16. The liquid ejecting apparatus according to claim 15, further comprising a housing accommodating the liquid ejecting head unit, wherein
the opening faces an inside of the housing of the liquid ejecting apparatus.

* * * * *